(12) United States Patent
Shohji

(10) Patent No.: US 11,444,005 B2
(45) Date of Patent: Sep. 13, 2022

(54) SEMICONDUCTOR DEVICE, IMAGING DEVICE, AND MANUFACTURING APPARATUS

(71) Applicant: SONY SEMICONDUCTOR SOLUTIONS CORPORATION, Kanagawa (JP)

(72) Inventor: Reijiroh Shohji, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/754,633

(22) PCT Filed: Oct. 5, 2018

(86) PCT No.: PCT/JP2018/037324
§ 371 (c)(1),
(2) Date: Apr. 8, 2020

(87) PCT Pub. No.: WO2019/078029
PCT Pub. Date: Apr. 25, 2019

(65) Prior Publication Data
US 2020/0357723 A1    Nov. 12, 2020

(30) Foreign Application Priority Data

Oct. 19, 2017   (JP) ............................. JP2017-202384

(51) Int. Cl.
*H01L 23/48*    (2006.01)
*H01L 21/768*   (2006.01)
(Continued)

(52) U.S. Cl.
CPC ...... *H01L 23/481* (2013.01); *H01L 21/76831* (2013.01); *H01L 21/76898* (2013.01);
(Continued)

(58) Field of Classification Search
CPC ............. H01L 23/481; H01L 21/76831; H01L 21/76898; H01L 21/7682; H01L 24/05;
(Continued)

(56) References Cited

U.S. PATENT DOCUMENTS

2011/0254165 A1    10/2011   Muranaka
2012/0013022 A1*   1/2012    Sabuncuoglu Tezcan ...................
                                                    H01L 23/481
                                                          257/774
(Continued)

FOREIGN PATENT DOCUMENTS

CN      103403869 A    11/2013
CN      105405856 A    3/2016
(Continued)

OTHER PUBLICATIONS

International Search Report and Written Opinion of PCT Application No. PCT/JP2018/037324, dated Dec. 11, 2018, 11 pages of ISRWO.

*Primary Examiner* — Dao H Nguyen
(74) *Attorney, Agent, or Firm* — Chip Law Group

(57) ABSTRACT

The present technology relates to a semiconductor device, an imaging device, and a manufacturing apparatus, capable of providing a semiconductor substrate maintaining and improving insulating performance. A through hole that penetrates the semiconductor substrate, an electrode at the center of the through hole, and a space around the electrode are included. The through hole also penetrates an insulating film formed on the semiconductor substrate. A barrier metal is further included around the electrode. An insulating film is further included in the semiconductor substrate and the space. The semiconductor device has a multilayer structure, and the electrode connects wirings formed in different layers to each other. The present technology can be applied to, for (Continued)

example, an image sensor in which a logic circuit and a sensor circuit are laminated.

13 Claims, 24 Drawing Sheets

(51) Int. Cl.
*H01L 23/00* (2006.01)
*H01L 27/146* (2006.01)

(52) U.S. Cl.
CPC .............. *H01L 24/05* (2013.01); *H01L 24/13* (2013.01); *H01L 27/14623* (2013.01); *H01L 27/14636* (2013.01); *H01L 27/14634* (2013.01); *H01L 2224/02372* (2013.01); *H01L 2224/13024* (2013.01)

(58) Field of Classification Search
CPC ... H01L 24/13; H01L 24/08; H01L 27/14623; H01L 27/14636; H01L 27/1463; H01L 2224/02372; H01L 2224/13024
USPC ......................................................... 257/435
See application file for complete search history.

(56) References Cited

U.S. PATENT DOCUMENTS

| | | | | |
|---|---|---|---|---|
| 2012/0292782 | A1* | 11/2012 | Lee | H01L 23/481 257/774 |
| 2013/0052794 | A1* | 2/2013 | Bang | H01L 23/481 438/424 |
| 2013/0115769 | A1* | 5/2013 | Yu | H01L 21/76898 438/667 |
| 2014/0054662 | A1 | 2/2014 | Yanagita et al. | |
| 2016/0204156 | A1* | 7/2016 | Togashi | H04N 5/3745 257/292 |
| 2016/0211288 | A1* | 7/2016 | Yanagita | H01L 27/1461 |
| 2016/0336372 | A1 | 11/2016 | Yanagita et al. | |
| 2016/0351492 | A1 | 12/2016 | Watanabe et al. | |
| 2017/0170217 | A1 | 6/2017 | Yanagita et al. | |
| 2017/0271385 | A1 | 9/2017 | Yanagita et al. | |
| 2018/0006073 | A1 | 1/2018 | Togashi | |

FOREIGN PATENT DOCUMENTS

| | | |
|---|---|---|
| CN | 105409002 A | 3/2016 |
| CN | 106067468 A | 11/2016 |
| CN | 106206337 A | 12/2016 |
| CN | 106229323 A | 12/2016 |
| JP | 2003-163266 A | 6/2003 |
| JP | 2006-049361 A | 2/2006 |
| JP | 2011-228419 A | 11/2011 |
| JP | 2013-175494 A | 9/2013 |
| JP | 2014-041951 A | 3/2014 |
| JP | 2015-038931 A | 2/2015 |
| JP | 2016-225478 A | 12/2016 |
| KR | 10-2014-0015326 A | 2/2014 |
| KR | 10-2016-0045054 A | 4/2016 |
| TW | 201642365 A | 12/2016 |
| TW | 201735204 A | 10/2017 |
| WO | 2012/117931 A1 | 9/2012 |
| WO | 2015/025723 A1 | 2/2015 |
| WO | 2017/169314 A1 | 10/2017 |

* cited by examiner

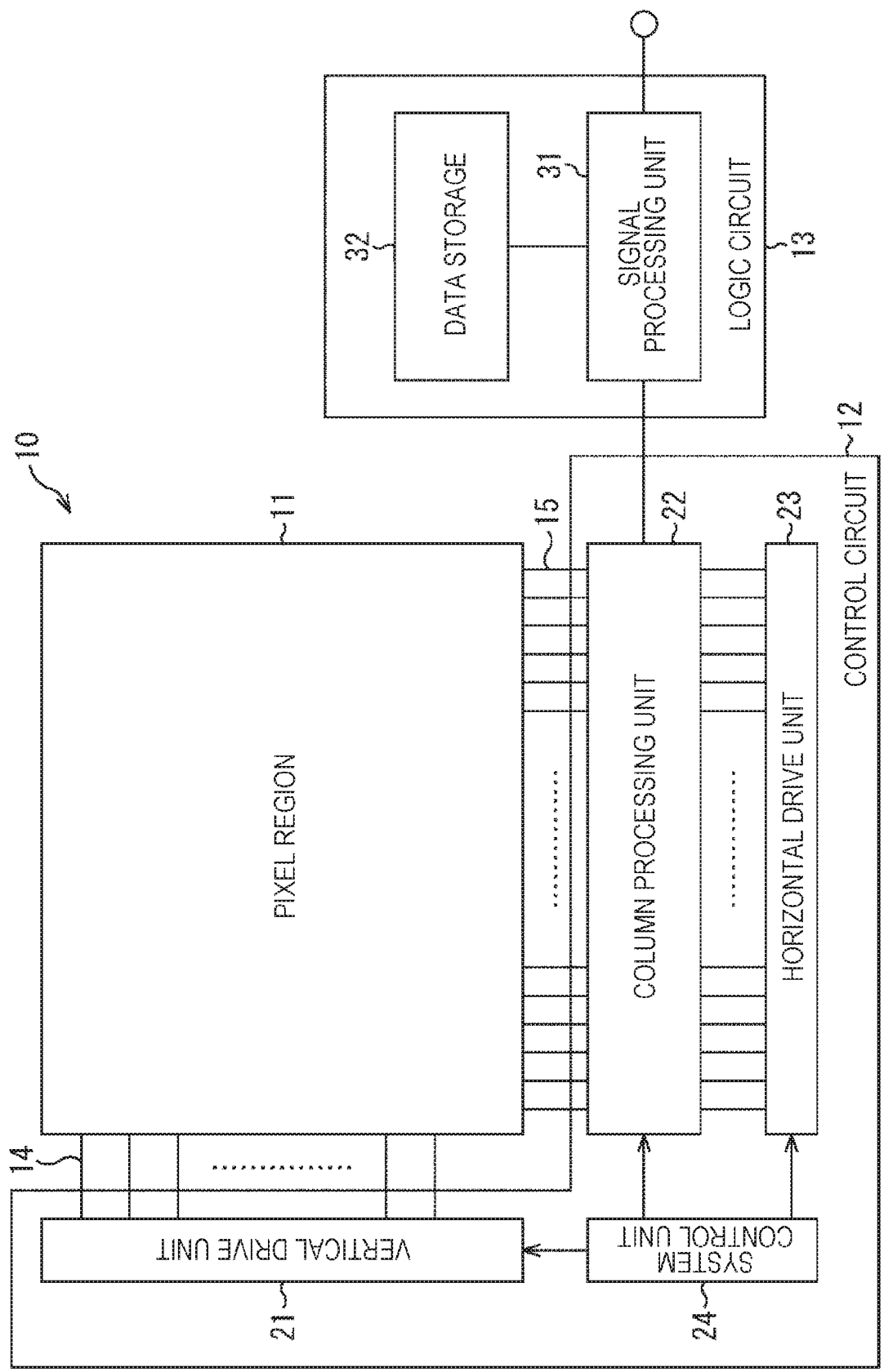

SEMICONDUCTOR DEVICE, IMAGING DEVICE, AND MANUFACTURING APPARATUS

CROSS REFERENCE TO RELATED APPLICATIONS

This application is a U.S. National Phase of International Patent Application No. PCT/JP2018/037324 filed on Oct. 5, 2018, which claims priority benefit of Japanese Patent Application No. JP 2017-202384 filed in the Japan Patent Office on Oct. 19, 2017. Each of the above-referenced applications is hereby incorporated herein by reference in its entirety.

TECHNICAL FIELD

The present technology relates to a semiconductor device, an imaging device, and a manufacturing apparatus, and relates to, for example, a semiconductor device, an imaging device, and a manufacturing apparatus that are suitable for application to an electrode connecting wirings formed in laminated layers to each other.

BACKGROUND ART

In recent years, as demands for miniaturization and higher speed of a semiconductor device increase, miniaturization and multilayering of wiring have been promoted. For example, in a solid-state imaging device, a solid-state imaging device configured as one device by electrically connecting a semiconductor chip in which a pixel region having a plurality of pixels arranged therein is formed to a semiconductor chip in which a logic circuit that performs signal processing is formed has been proposed.

For example, Patent Document 1 discloses a semiconductor module in which a back-illuminated image sensor chip having a pad for each pixel cell is connected to a signal processing chip having a signal processing circuit formed therein and having a pad by a bump.

In a semiconductor device having such a multilayer wiring process, wiring delay may cause signal delay of the semiconductor device. Therefore, Patent Document 2 has proposed a semiconductor device with reduced inter-wiring capacitance.

CITATION LIST

Patent Document

Patent Document 1: Japanese Patent Application Laid-Open No. 2006-49361
Patent Document 2: Japanese Patent Application Laid-Open No. 2003-163266

SUMMARY OF THE INVENTION

Problems to be Solved by the Invention

In a semiconductor device having a laminated wiring process, it is necessary to reduce a diameter of an electrode for connecting upper and lower substrates to each other due to layout restrictions. In order to reduce the size, it is also necessary to reduce the thickness of an insulating film formed between an electrode and a silicon substrate. However, by making the insulating film thinner, it may be impossible to maintain required insulating performance. Therefore, it is desired to reduce the size without degrading the insulating performance.

The present technology has been achieved in view of such a situation, and can provide a substrate maintaining insulating performance of an electrode for connecting upper and lower substrates to each other.

Solutions to Problems

A semiconductor device according to an aspect of the present technology includes a through hole that penetrates a semiconductor substrate, an electrode at the center of the through hole, and a space around the electrode.

An imaging device according to an aspect of the present technology includes a photoelectric conversion unit that performs photoelectric conversion, and an inter-pixel light shielding unit formed between the photoelectric conversion units each formed in an adjacent pixel through a semiconductor substrate in a depth direction. The inter-pixel light shielding unit includes a light shielding member at the center, and has a space between the light shielding member and the semiconductor substrate.

A manufacturing apparatus according to an aspect of the present technology manufactures a semiconductor device including a through hole that penetrates a semiconductor substrate, an electrode at the center of the through hole, and a space around the electrode.

In a semiconductor device according to an aspect of the present technology, a through hole that penetrates a semiconductor substrate, an electrode at the center of the through hole, and a space around the electrode are included.

In an imaging device according to an aspect of the present technology, a photoelectric conversion unit that performs photoelectric conversion, and an inter-pixel light shielding unit formed between the photoelectric conversion units each formed in an adjacent pixel through a semiconductor substrate in a depth direction are included. The inter-pixel light shielding unit includes a light shielding member at the center, and has a space between the light shielding member and the semiconductor substrate.

In a manufacturing apparatus according to an aspect of the present technology, a semiconductor device including a through hole that penetrates a semiconductor substrate, an electrode at the center of the through hole, and a space around the electrode is manufactured.

Effects of the Invention

According to an aspect of the present technology, it is possible to provide a substrate maintaining insulating performance of an electrode for connecting upper and lower substrates to each other.

Note that the effects described here are not necessarily limited, and may be any of the effects described in the present disclosure.

BRIEF DESCRIPTION OF DRAWINGS

FIG. 1 is a diagram illustrating a configuration of an embodiment of a semiconductor device to which the present disclosure is applied.

MODE FOR CARRYING OUT THE INVENTION

Figure 2A:
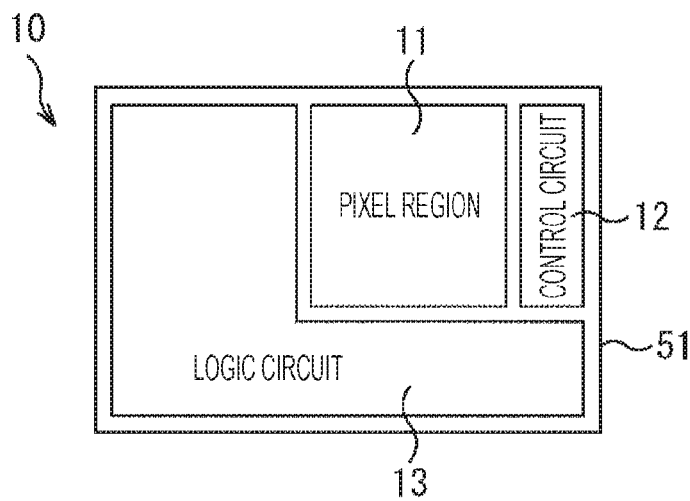
FIGS. 2A, 2B, and 2C are diagrams for explaining lamination of substrates.

Hereinafter, modes for carrying out the present technology (hereinafter, referred to as embodiments) will be described.

<Configuration Example of CMOS Image Sensor>

FIG. 1 is a diagram illustrating a configuration example of an embodiment of a CMOS image sensor as a semiconductor device to which the present disclosure is applied.

The present technology can be applied to an electrode connecting signal lines of substrates to be laminated or electrode lines (hereinafter referred to as a through electrode). Therefore, a CMOS image sensor will be described as an example of a semiconductor device including such a through electrode.

A scope of application of the present technology is not limited to a CMOS image sensor, and can be applied to a plurality of substrates (semiconductor substrates) when the substrates are laminated.

In a CMOS image sensor 10, a pixel region 11, a control circuit 12, a logic circuit 13, a pixel drive line 14, and a vertical signal line 15 are formed on a semiconductor substrate (chip) such as a silicon substrate (not illustrated).

The CMOS image sensor 10 images an image of a subject and outputs a pixel signal of each pixel.

Specifically, in the pixel region 11, pixels each having a photoelectric conversion element that generates charges having a charge amount corresponding to the amount of incident light and stores the charges therein are arranged two-dimensionally in a matrix, and the pixel region 11 images an image. Furthermore, in the pixel region 11, pixel drive lines 14 are formed in the horizontal direction (row direction) in the drawing for each row of the matrix-like pixels, and the vertical signal lines 15 are formed in the vertical direction (column direction) in the drawing for each column thereof.

Furthermore, the control circuit 12 includes a vertical drive unit 21, a column processing unit 22, a horizontal drive unit 23, and a system control unit 24, and controls read-out of a pixel signal.

Specifically, the vertical drive unit 21 includes a shift register, an address decoder, and the like, and drives each pixel in the pixel region 11, for example, in units of rows or the like. One end of the pixel drive line 14 is connected to an output terminal (not illustrated) corresponding to each row of the vertical drive unit 21. A specific configuration of the vertical drive unit 21 is not illustrated, but the vertical drive unit 21 has two scanning systems, that is, a read-out scanning system and a sweep-out scanning system.

The read-out scanning system sequentially selects each row so as to sequentially read out a pixel signal from each pixel in units of rows, and outputs a selection pulse or the like from an output terminal connected to the pixel drive line 14 in a selected row.

In order to sweep out (reset) unnecessary charges from the photoelectric conversion element, the sweep-out scanning system outputs a control pulse from an output terminal connected to the pixel drive line 14 of each row prior to scanning of the read-out system by a period of time of a shutter speed. By the scanning by the sweep-out scanning system, so-called electronic shutter operation is sequentially performed for each row. Here, the electronic shutter operation refers to an operation in which charges of the photoelectric conversion element are discarded and exposure is newly started (charge accumulation is started).

A pixel signal output from each pixel in a row selected by the read-out scanning system of the vertical drive unit 21 is supplied to the column processing unit 22 through each of the vertical signal lines 15.

The column processing unit 22 has a signal processing circuit for each column of the pixel region 11. Each signal processing circuit of the column processing unit 22 performs signal processing, for example, a noise removal process such as a correlated double sampling (CDS) process or an A/D conversion process on a pixel signal output from each pixel of a selected row through the vertical signal line 15. The CDS process removes a fixed pattern noise unique to a pixel, such as a reset noise or a threshold variation of an amplifier transistor. The column processing unit 22 temporarily holds a pixel signal after the signal processing.

The horizontal drive unit 23 includes a shift register, an address decoder, and the like, and sequentially selects a signal processing circuit of the column processing unit 22. By selective scanning by the horizontal drive unit 23, a pixel signal that has been subjected to signal processing by each signal processing circuit of the column processing unit 22 is sequentially output to the logic circuit 13.

The system control unit 24 includes a timing generator that generates various timing signals and the like, and controls the vertical drive unit 21, the column processing unit 22, and the horizontal drive unit 23 on the basis of the various timing signals generated by the timing generator.

The logic circuit 13 includes a signal processing unit 31 and a memory 32, and performs predetermined signal processing on a pixel signal supplied from the control circuit 12.

Specifically, the signal processing unit 31 has at least an addition processing function. The signal processing unit 31 performs various signal processes such as addition processing on a pixel signal output from the column processing unit 22. At this time, the signal processing unit 31 stores a signal processing intermediate result and the like in the memory 32 as necessary, and refers to the result at a necessary timing. The signal processing unit 31 outputs a pixel signal after signal processing.

The memory 32 includes dynamic random access memory (DRAM), static random access memory (SRAM), and the like.

Each pixel of the pixel region 11, the control circuit 12, and the logic circuit 13 in the CMOS image sensor 10 configured as described above include various active elements. For example, each pixel of the pixel region includes a photodiode, a transistor, and the like.

<Disposition Example in CMOS Image Sensor>

Figure 2B:
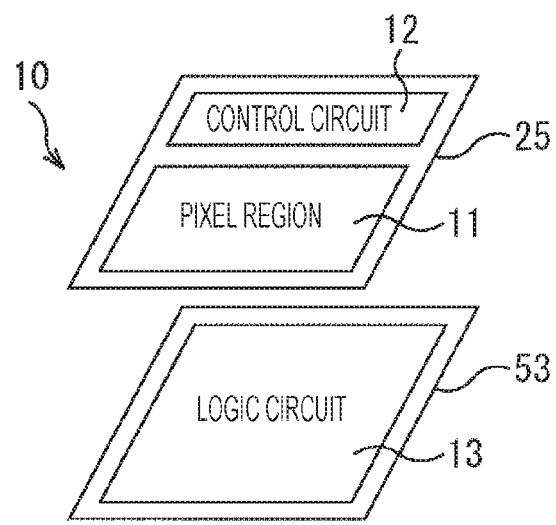
Figure 2C:
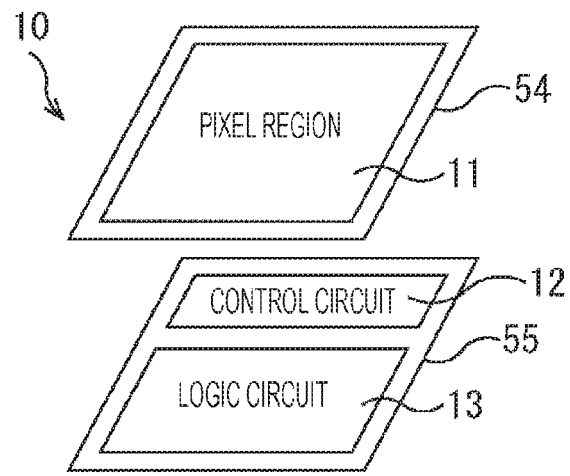

FIGS. 2A, 2B, and 2C are diagrams illustrating a disposition example of the CMOS image sensor 10 of FIG. 1.

The disposition of the pixel region 11, the control circuit 12, and the logic circuit 13 in the CMOS image sensor 10 can be, for example, any one of the first to third dispositions illustrated in FIGS. 2A, 2B, and 2C.

That is, the disposition of the pixel region 11, the control circuit 12, and the logic circuit 13 in the CMOS image sensor 10 may be the first disposition in which all of the pixel region 11, the control circuit 12, and the logic circuit 13 are disposed on one semiconductor substrate 51 as illustrated in FIG. 2A.

Furthermore, the disposition of the pixel region 11, the control circuit 12, and the logic circuit 13 in the CMOS image sensor 10 can be the second disposition in which the pixel region 11 and the control circuit 12 are disposed on one of two semiconductor substrates 52 and 53 laminated, and the logic circuit 13 is disposed on the other one, as illustrated in FIG. 2B. In the example of FIG. 2B, the pixel region 11 and the control circuit 12 are disposed on the semiconductor substrate 52, and the logic circuit 13 is disposed on the semiconductor substrate 53.

Moreover, the disposition of the pixel region 11, the control circuit 12, and the logic circuit 13 in the CMOS image sensor 10 can be the third disposition in which the pixel region 11 is disposed on one of two semiconductor substrates 54 and 55 laminated, and the control circuit 12 and the logic circuit 13 are disposed on the other one, as illustrated in FIG. 2C. In the example of FIG. 2C, the pixel region 11 is disposed on the semiconductor substrate 54, and the control circuit 12 and the logic circuit 13 are disposed on the semiconductor substrate 55.

In a case where the CMOS image sensor 10 is a laminated image sensor as illustrated in FIGS. 2B and 2C, the semiconductor substrate 52 (54) and the semiconductor substrate 53 (55) are connected to each other using a through electrode. Here, the through electrode will be described.

Figure 3:
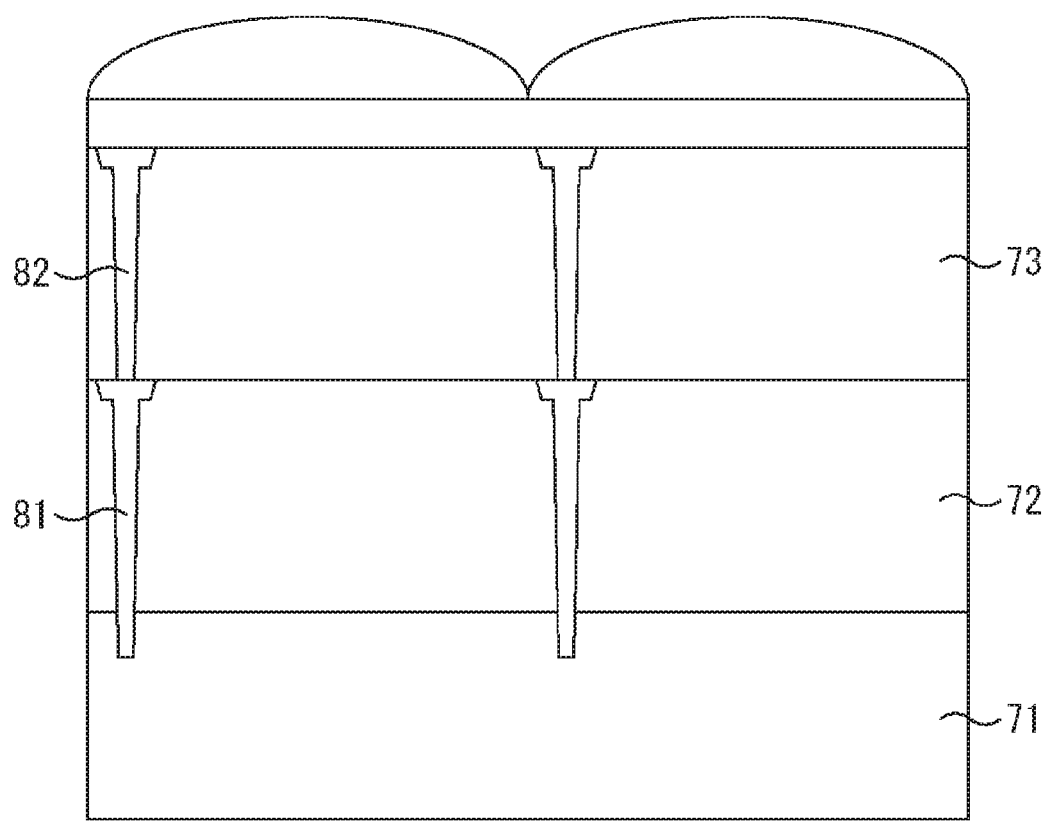
FIG. 3 is a diagram for explaining a through electrode.

FIG. 3 illustrates a semiconductor device in which a logic circuit chip 71, a memory chip 72, and a CMOS image sensor (CIS) chip 73 are laminated. On the logic circuit chip 71, for example, an input/output unit, a circuit unit, a protection circuit, and the like are mounted.

The memory chip 72 is a memory chip such as DRAM. On the memory chip 72, a memory cell (not illustrated) and a decoder (not illustrated) that reads out data from the memory cell are mounted. Data and control signal writing/reading-out lines of the memory chip 72 are drawn from an external chip via the through electrode.

The CIS chip 73 includes the CMOS image sensor 10. On a back surface of the CIS chip 73, a bump (not illustrated) is formed. A plurality of bumps is formed on the back surface. The CIS chip 73 can be connected to a processing unit (not illustrated) via the bumps.

Referring again to FIG. 3, in a case where a plurality of chips is laminated, a through electrode is disposed, and the chips are electrically connected to each other via the through electrode.

In the memory chip 72 and the CIS chip 73, a through electrode 81 and a through electrode 82 are disposed, respectively. By connection between the through electrode 81 and the through electrode 82, the logic circuit chip 71, the memory chip 72, and the CIS chip 73 are connected to each other such that data and power can be exchanged therebetween.

Note that a function such as data exchange or power exchange is assigned to each of the through electrodes. Here, unless otherwise noted, the description will be continued assuming that the through electrodes are used for data exchange.

The memory chip 72 includes the through electrode 81 in order to output an output from the memory chip 72 to the logic circuit chip 71 or to output an output from the logic circuit chip 71 to the memory chip 72.

Similarly, the CIS chip 73 includes the through electrode 82 in order to output an output from the CIS chip 73 to the logic circuit chip 71 or to output an output from the logic circuit chip 71 to the CIS chip 73.

Each of the memory chip 72 and the CIS chip 73 includes a plurality of such through electrodes such that data can be exchanged between the laminated chips.

<First Configuration of Through Electrode>

Figure 4:
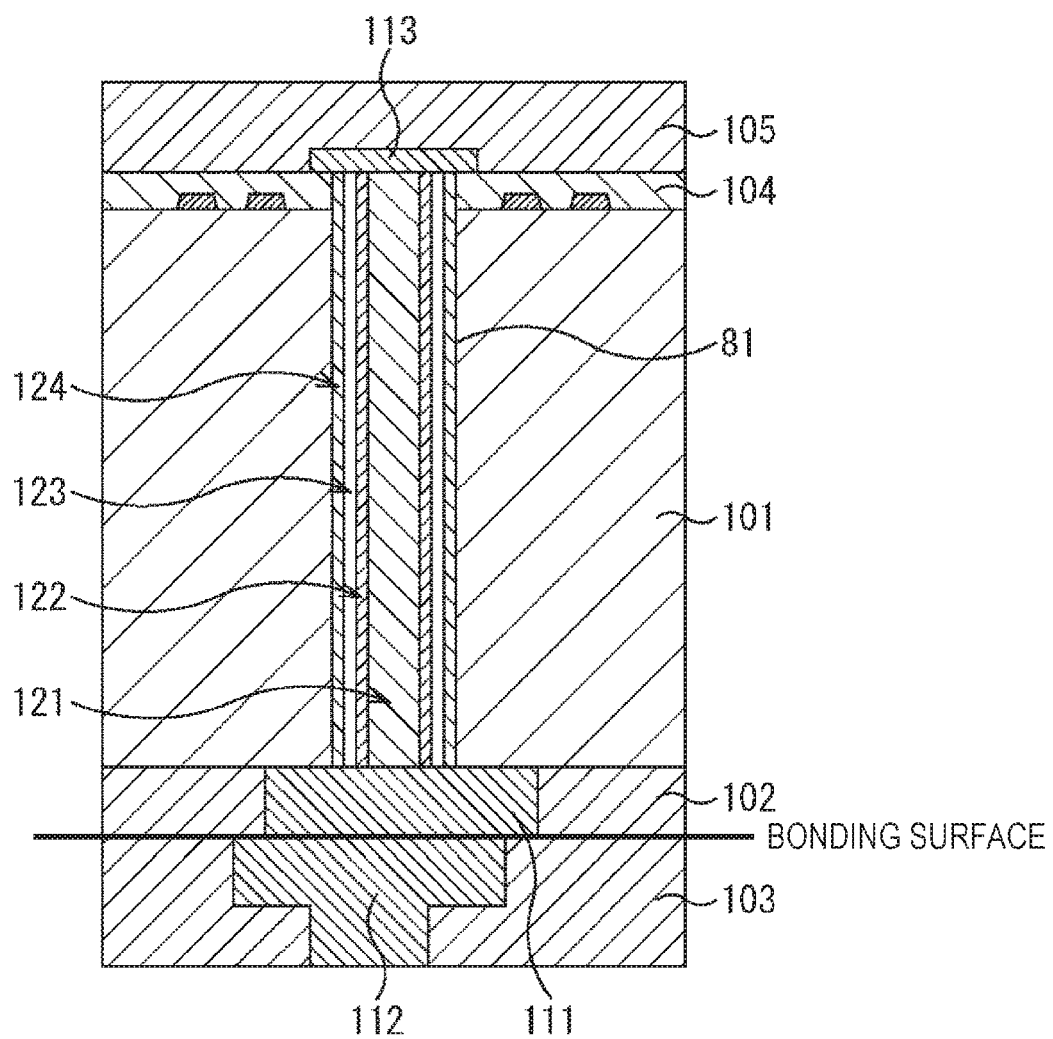
FIG. 4 is a cross-sectional view for explaining a first configuration of the through electrode.
Figure 5:
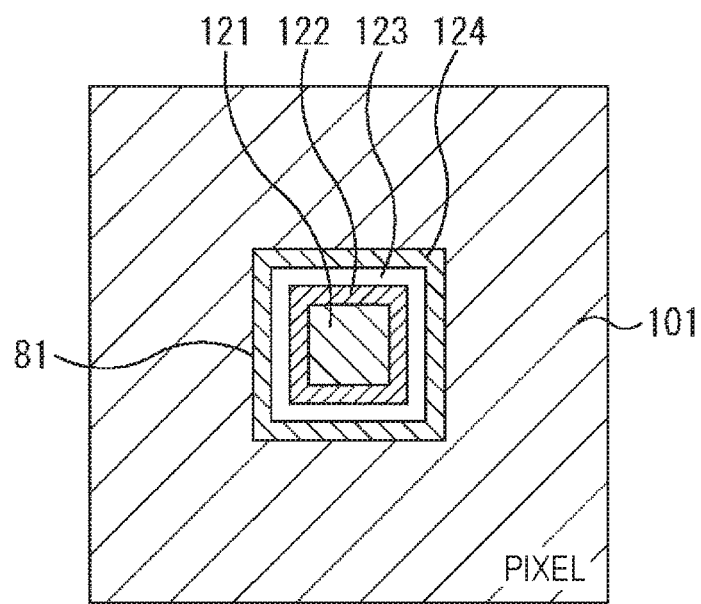
FIG. 5 is a plan view for explaining the first configuration of the through electrode.

FIG. 4 is a cross-sectional view illustrating a detailed first configuration of each of the through electrodes 81 and 82 (hereinafter, the through electrode 81 is exemplified) in the vertical direction, and FIG. 5 is a plan view thereof in the horizontal direction.

The through electrode 81 is formed through a silicon (Si) substrate 101. On a lower side of the Si substrate 101 in the drawing, a silicon oxide (SiO) layer 102 and a SiO layer 103 are laminated. The SiO layer 102 and the SiO layer 103 are different substrates, for example, substrates corresponding to the logic circuit chip 71 and the memory chip 72 in FIG. 3, and are bonded at a bonding surface.

Wiring 111 is formed in the SiO layer 102, and wiring 112 is formed in the SiO layer 103. The wiring 111 and the wiring 112 are connected to each other. The wiring 111 is connected to an electrode 121 formed in the through electrode 81. The electrode 121 is also connected to an AL pad 113. The wiring 111, the wiring 112, and the AL pad 113 are formed using copper (Cu), aluminum (Al), tungsten (W), or the like.

The AL pad 113 is formed in a SiO layer 105 laminated on an upper side of the Si substrate 101 in the drawing. Between the Si substrate 101 and the SiO layer 105, a pre-metal dielectric (PMD) 104 is formed.

The through electrode 81 is a through hole that penetrates a semiconductor substrate, in this case, the Si substrate 101. An electrode 121 is formed at the center of the through hole, and a barrier metal 122 is formed around the electrode 121.

Furthermore, the through hole is formed as a through hole also penetrating the PMD 104 formed on the Si substrate 101.

The barrier metal 122 is a metal film formed such that, for example, in a case where copper (Cu) is used for the electrode 121, the copper does not diffuse into an oxide film. Depending on a material used for the electrode 121, reliability of the through electrode 81, and the like, it is also possible not to form the barrier metal 122. In a case where the barrier metal 122 is formed, tantalum (Ta), titanium (Ti), tungsten (W), zirconium (Zr), a nitride film thereof, a carbide film thereof, and the like can be used as a material of the barrier metal 122.

A hollow groove 123 is formed outside the barrier metal 122. The hollow groove 123 is a space having a predetermined width and not filled with a predetermined substance such as a solid or a liquid.

A silicon carbide (SiC) film 124 is formed between the hollow groove 123 and the Si substrate 101.

The wiring 111, the wiring 112, the AL pad 113, and the electrode 121 may include the same material, for example, copper (Cu), or may include different materials. In a case where the wiring 111, the wiring 112, the AL pad 113, and the electrode 121 include different materials, for example, the wiring 111, the wiring 112, and the AL pad 113 can include copper (Cu), and the electrode 121 can include tungsten (W).

For example, the through electrode 81 may be formed so as to be disposed for each pixel arranged in an array in the pixel region 11 (FIG. 1).

The through electrode 81 includes the hollow groove 123 between the electrode 121 and the Si substrate 101. For example, in a case where heat is applied when or after the through electrode 81 is manufactured, if parts constituting the through electrode 81 have different coefficients of thermal expansion, an unnecessary stress may be generated.

For example, in the through electrode 81 illustrated in FIG. 4, in a case where the hollow groove 123 is not formed and a portion corresponding to the hollow groove 123 is also formed using the SiC film 124, in other words, in a case where the barrier metal 122 and the SiC film 124 are in contact with each other, the through electrode 81 includes the electrode 121, the barrier metal 122, and the SiC film 124.

In a case of such a structure, the electrode 121, the barrier metal 122, the SiC film 124, and the Si substrate 101 have different coefficients of thermal expansion. An unnecessary stress may be generated, and a defect may be generated in shape.

According to the through electrode 81 illustrated in FIG. 4, the hollow groove 123 is formed. Therefore, the hollow groove 123 can absorb and relieve a stress that may be generated by a difference in coefficient of thermal expansion among the electrode 121, the barrier metal 122, the SiC film 124, and the Si substrate 101. Therefore, generation of a defect in shape due to generation of an unnecessary stress can be prevented.

Furthermore, the SiC film 124 is used as an insulating film, but the hollow groove 123 can also be used as an insulating film. Therefore, insulating performance can be maintained and improved. Improvement of the insulating performance can, for example, reduce an influence of an electric field from the through electrode 81 on a transistor or the like connected to the through electrode 81.

Furthermore, it is possible to laminate chips that can prevent generation of a defect in shape due to generation of an unnecessary stress. The lamination can reduce the size.

<Manufacture of Through Electrode Having First Configuration>

Manufacture of the through electrode 81 illustrated in FIGS. 4 and 5 will be described with reference to FIGS. 6 to 8.

In step S11 (FIG. 6), the Si substrate 101 on which the SiO layer 105 having the PMD 104 and the AL pad 113 embedded therein is formed is formed.

In step S12, a SiO film 151 is formed as a resist on the opposite surface (lower side in the drawing) to the SiO layer 105 in order to form a via in a portion where the through electrode 81 is to be formed. In step S13, patterning in which a portion where the via is to be formed is opened is performed.

In step S14, the Si substrate 101 and the PMD 104 are etched to expose the AL pad 113. In this step, a via 153 is formed. In step S15, a resist film, in this case, the SiO film 151 is removed.

In step S16, a SiC film 155 is formed on side surfaces of the via 153, an exposed surface of the AL pad 113, and a surface other than a portion where the via 153 is opened on a bottom surface of the Si substrate 101. The SiC film 155 is a film to be the SiC film 124 and is formed as an insulating film of the through electrode 81.

In step S17 (FIG. 7), a SiO film 157 is further formed on SiC film 155. Through this step, as illustrated in step S17 of FIG. 7, two layers of the SiC film 155 and the SiO film 157 are formed in the via 153.

In step S18, etch back is performed on the two layers of the SiC film 155 and the SiO film 157 formed in the via 153. In this step S18, the SiC film 155 and the SiO film 157 formed on portions other than side surfaces in the via 153 are removed. In other words, the SiC film 155 and the SiO film 157 formed on a bottom of the via 153 (a side on which the AL pad 113 is present) and the bottom surface of the Si substrate 101 (a lower side in the drawing, opposite to the SiO layer 105) are removed.

By performing the process in step S18, the AL pad 113 is exposed. Furthermore, two layers of the SiC film 155 and the SiO film 157 are formed on a part of the AL pad 113 (an end side of the opening).

The film thickness of the SiC film 155 and the SiO film 157 formed on the side surfaces of the via 153 can be 1 μm, for example. For example, when the thickness is 1 μm, the SiC film 155 and the SiO film 157 may have the same thickness, that is, in this case, 0.5 μm, or may have different thicknesses.

In step S19, a barrier metal 159 is formed. The barrier metal 159 is formed on the side surfaces of the via 153, the exposed surface of the AL pad 113, and a surface other than the portion where the via 153 is opened on the bottom surface of the Si substrate 101. The barrier metal 159 is a film to be the barrier metal 122.

In step S20, the via 153 is filled with a metal material 161 to be an electrode, for example, tungsten (W) or copper (Cu). In step S21, an unnecessary portion of the metal material 161 and the barrier metal 159 are removed. For example, the process of step S20 is performed by removing the metal material 161 and the barrier metal 159 formed on the Si substrate 101 by a chemical mechanical polishing (CMP) method and planarizing the Si substrate 101.

Through the steps so far, the electrode 121, the barrier metal 122, and the SiC film 124 constituting the through electrode 81 are formed. In a subsequent step S22, the hollow groove 123 is formed. That is, in step S22, the SiO film 157 is etched, and the SiO film 157 is thereby removed to form the hollow groove 123. This etching can be performed by wet etching using a solvent capable of selectively dissolving SiO.

Figure 8:
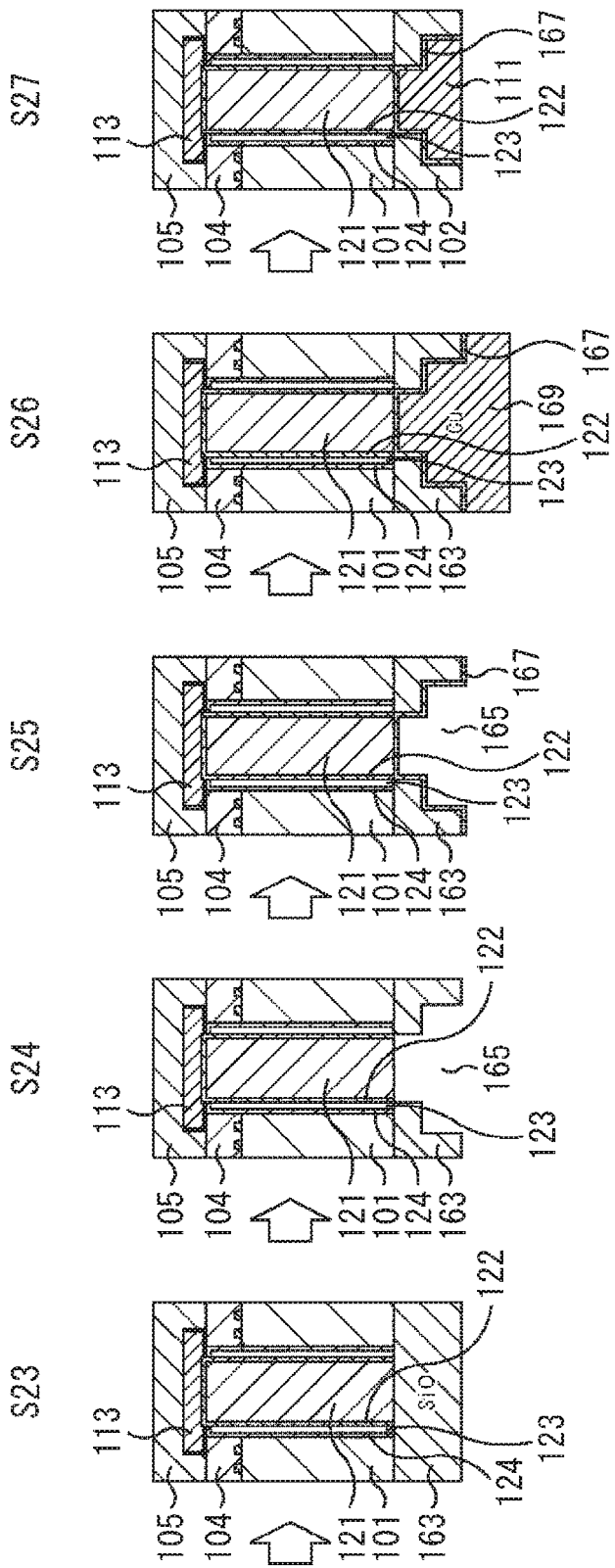
FIG. 8 is a diagram for explaining manufacturing of the through electrode.

When the hollow groove 123 is formed in this way, the process proceeds to step S23 (FIG. 8). In step S23, a SiO film 163 is formed on a bottom surface of the Si substrate 101 (a lower side in the drawing, opposite to the SiO layer 105). The SiO film 163 is a film to be the SiO layer 102.

In step S24, in order to form a portion corresponding to the wiring 111 (FIG. 4), the SiO film 163 is processed, and a portion (hole 165) to be the wiring 111 is formed. The SiO film 163 is processed by a process such as application of a resist, patterning, or etching.

In step S24, a barrier metal 167 is formed in a hole 165. Furthermore, the barrier metal 167 is also formed on a portion other than the hole 165 of the Si substrate 101.

In step S26, the hole 165 is filled with copper 169 to form a portion corresponding to the wiring 111. In step S27, an unnecessary portion of the copper 169 and the barrier metal 167 are removed. This removal can be performed by removing the barrier metal 167 and the copper 169 formed on the Si substrate 101 by the CMP method and planarizing the Si substrate 101 as in step S21.

Through such steps, the through electrode 81 having the hollow groove 123 can be formed.

<Other Manufacture of Through Electrode Having First Configuration>

The through electrode 81 having the hollow groove 123 can also be manufactured through another manufacturing process. For example, in the manufacturing process described with reference to FIGS. 6 to 8, the via 153 is formed on the substrate on which the AL pad 113 is formed. In other words, in a case where a surface of the Si substrate 101 on which the AL pad 113 is formed is referred to as an upper surface, the case where the via 153 is formed from a lower surface side after processing on the upper surface side is completed has been described as an example.

The through electrode 81 can also be formed by performing digging from the upper surface side (the side on which the AL pad 113 is formed) of the Si substrate 101 so as to form the via 153. The case where the through electrode 81 is formed by performing processing from the upper surface side of the Si substrate 101 in this way will be described with reference to FIGS. 9 and 10. Note that description of similar steps to those described with reference to FIGS. 6 to 8 is omitted as appropriate.

In step S51, the Si substrate 101 on which the PMD 104 is formed is formed.

In step S52, the via 153 is formed by performing a process such as application of a resist, patterning, or etching in order to form a via in a portion where the through electrode 81 is to be formed. The via 153 is a hole penetrating the PMD 104 and dug to a predetermined depth of the Si substrate 101.

In step S53, the SiC film 155 is formed on side surfaces and a bottom surface of the via 153 and a surface other than a portion where the via 153 is opened on an upper surface of the PMD 104. Moreover, in step S54, the SiO film 157 is formed on the SiC film 155. Through this step, as illustrated in step S54 of FIG. 9, two layers of the SiC film 155 and the SiO film 157 are formed in the via 153.

In step S55, the two layers of the SiC film 155 and the SiO film 157 formed in the via 153 are etched back, and the SiC film 155 and the SiO film 157 formed on a portion other than the side surfaces in the via 153 are thereby removed.

In step S56, the barrier metal 159 is formed. The barrier metal 159 is formed on side surfaces and a bottom surface of the via 153 and a surface other than a portion where the via 153 is opened on an upper surface of the PMD 104. The barrier metal 159 is a film to be the barrier metal 122.

In step S57, the via 153 is filled with the metal material 161 to be an electrode. In step S58, an unnecessary portion of the metal material 161 and the barrier metal 159 are removed. In a subsequent step S59, the AL pad 113 is formed on the PMD 104, and the SiO layer 105 is formed.

In step S60, the Si substrate 101 is thinned, and the via 153 formed in the Si substrate 101 is thereby exposed. Note that a process for forming another portion may be performed, for example, a wiring layer may be formed on the SiO layer 105, between steps S59 and S60.

Figure 7:
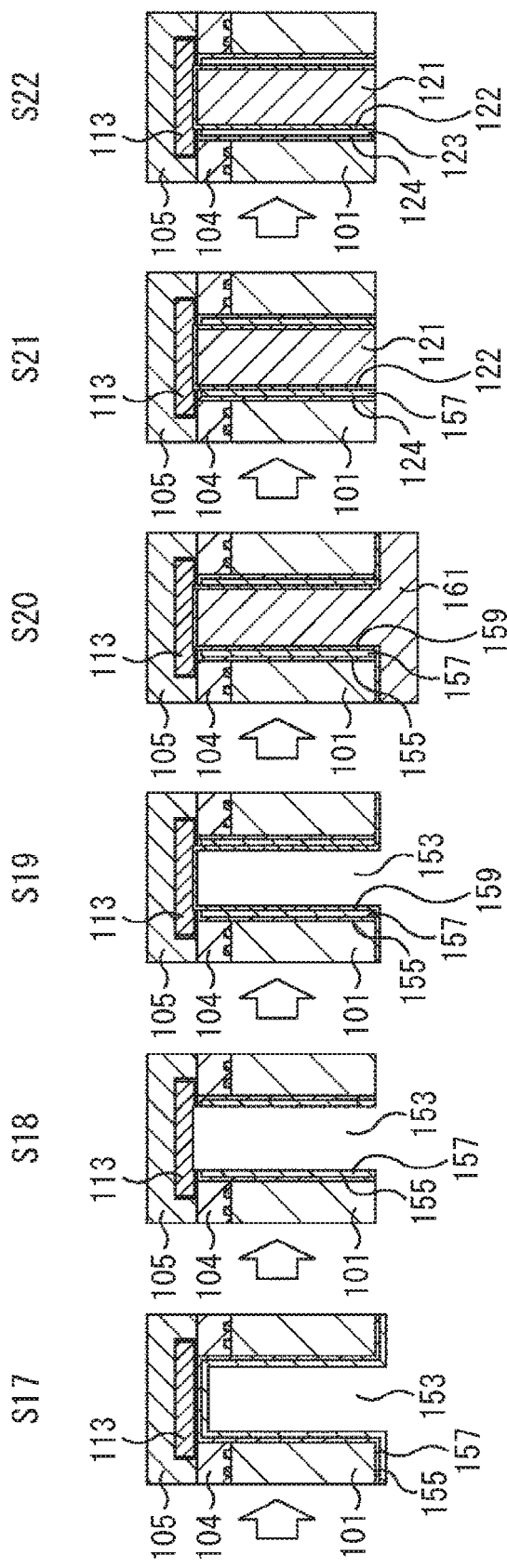
FIG. 7 is a diagram for explaining manufacturing of the through electrode.

The Si substrate 101 that has been processed in step S60 has a similar configuration to the Si substrate 101 that has been processed in step S21 (FIG. 7). That is, through the steps so far, the electrode 121, the barrier metal 122, and the SiC film 124 constituting the through electrode 81 are formed. In a subsequent step, the hollow groove 123 is formed.

That is, processes after step S60 can be performed in a similar manner to the processes after step S21, and therefore description thereof is omitted here.

Through such steps, the through electrode 81 having the hollow groove 123 can be formed.

<Second Configuration of Through Electrode>

Figure 11:
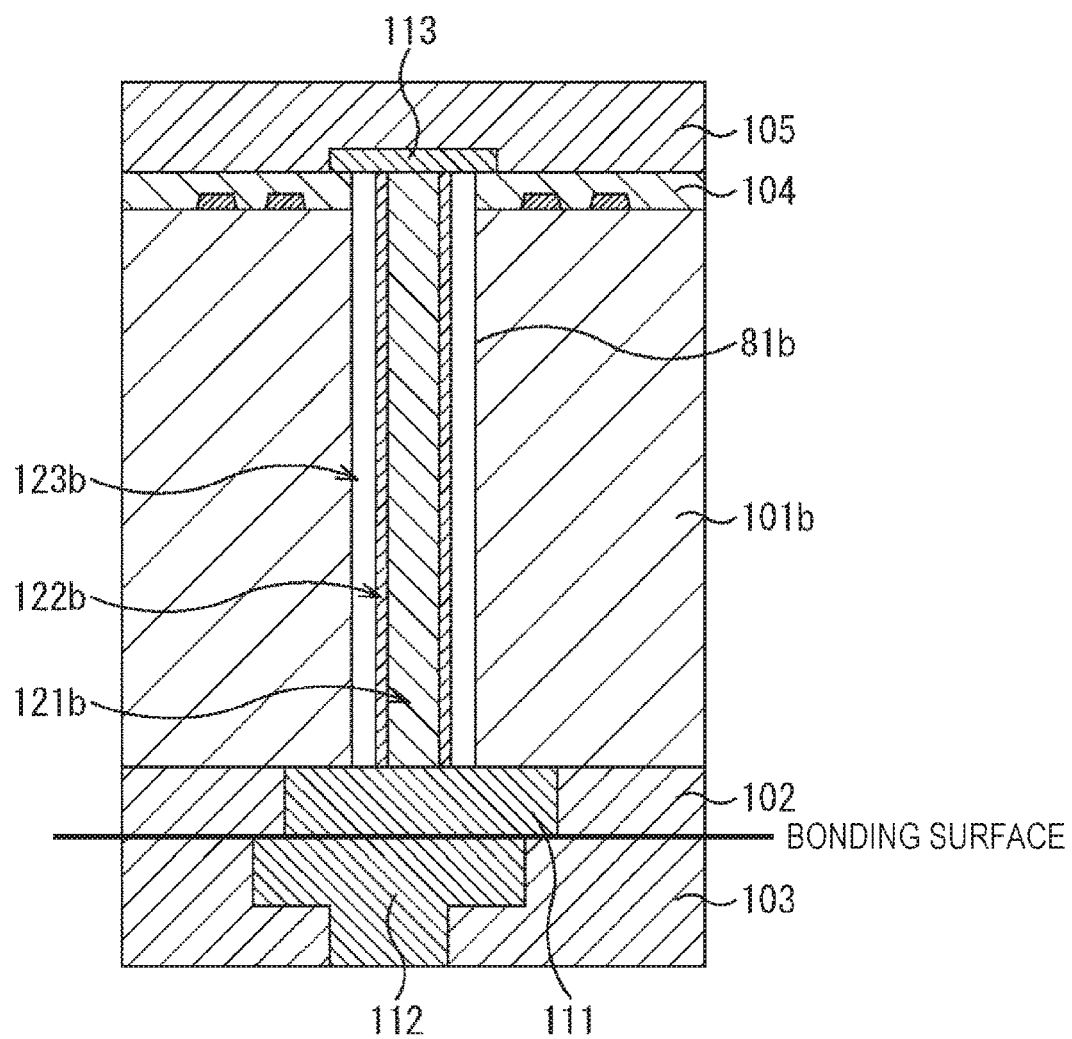
FIG. 11 is a cross-sectional view for explaining a second configuration of the through electrode.
Figure 12:
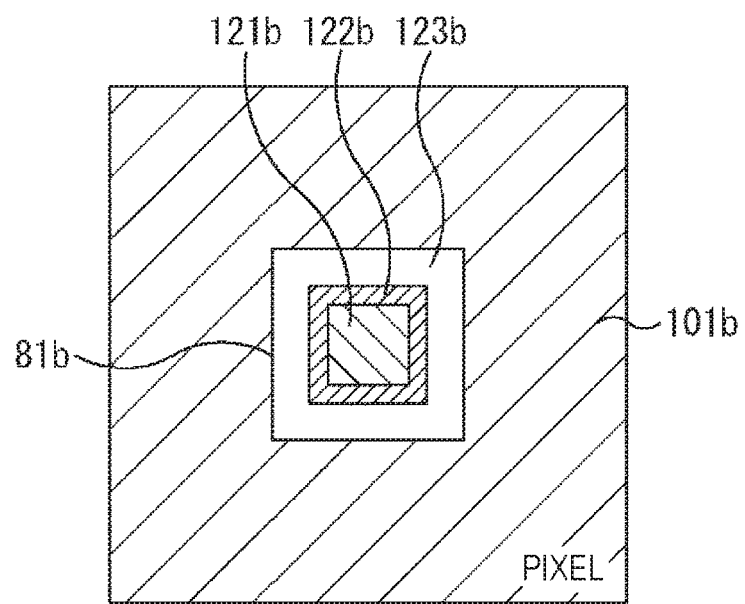
FIG. 12 is a plan view for explaining the second configuration of the through electrode.

FIG. 11 is a cross-sectional view illustrating a detailed second configuration of the through electrode 81 (here, referred to as a through electrode 81b) in the vertical direction, and FIG. 12 is a plan view thereof in the horizontal direction.

The through electrode 81b illustrated in FIG. 11 is different from the through electrode 81 illustrated in FIG. 4 in that the SiC film 124 is removed, and the other portions are similar.

The through electrode 81 illustrated in FIG. 4 includes the SiC film 124, and the SiC film 124 functions as an insulating film. The through electrode 81 to which the present technology is applied includes the hollow groove 123, and therefore the hollow groove 123 can function as an insulating film. Therefore, as illustrated in FIG. 11, even in a case where the through electrode 81b not including the SiC film 124 is used, the through electrode can maintain insulating performance.

In the through electrode 81b illustrated in FIGS. 11 and 12, only a hollow groove 123b is formed between a barrier metal 122b (electrode 121b) and a Si substrate 101b.

According to the through electrode 81b illustrated in FIG. 11, the hollow groove 123b is formed. Therefore, the hollow groove 123b can absorb and relieve a stress that may be generated by a difference in coefficient of thermal expansion among the electrode 121b, the barrier metal 122b, and the Si substrate 101b. Therefore, generation of a defect in shape due to generation of an unnecessary stress can be prevented.

Furthermore, the hollow groove 123b also functions as an insulating film, and therefore insulating performance can be maintained and improved. Improvement of the insulating performance can, for example, reduce an influence of an electric field from the through electrode 81b on a transistor or the like connected to the through electrode 81b.

<Manufacture of Through Electrode Having Second Configuration>

Figure 13:
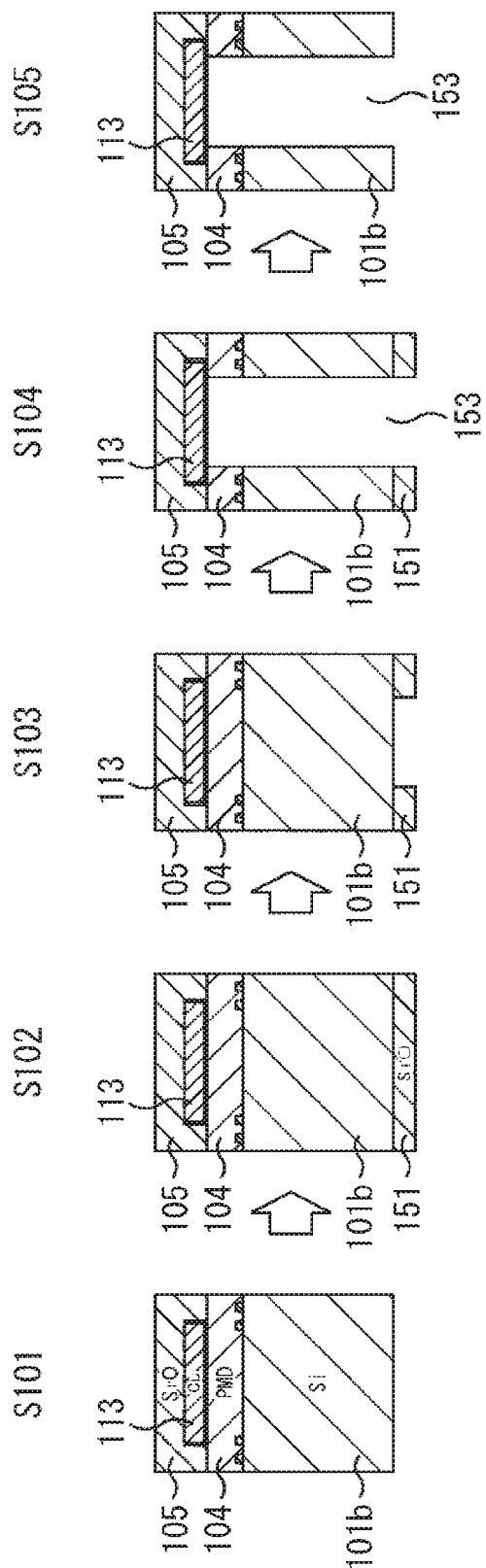
FIG. 13 is a diagram for explaining manufacturing of the through electrode.
Figure 14:
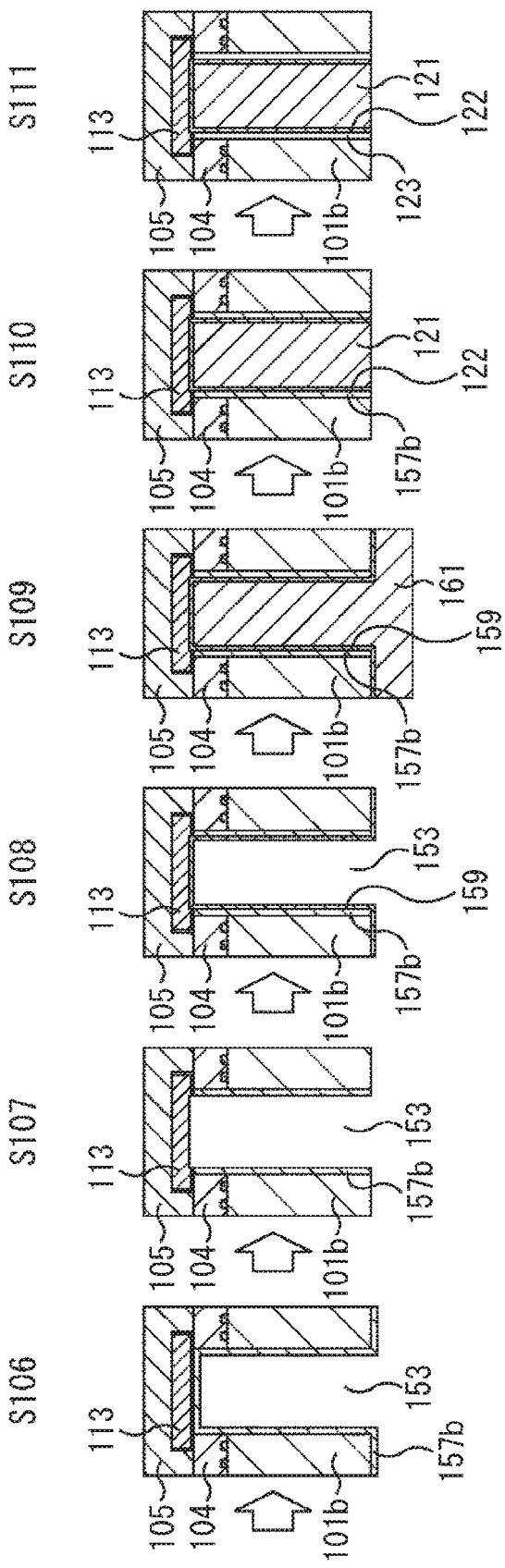
FIG. 14 is a diagram for explaining manufacturing of the through electrode.
Figure 15:
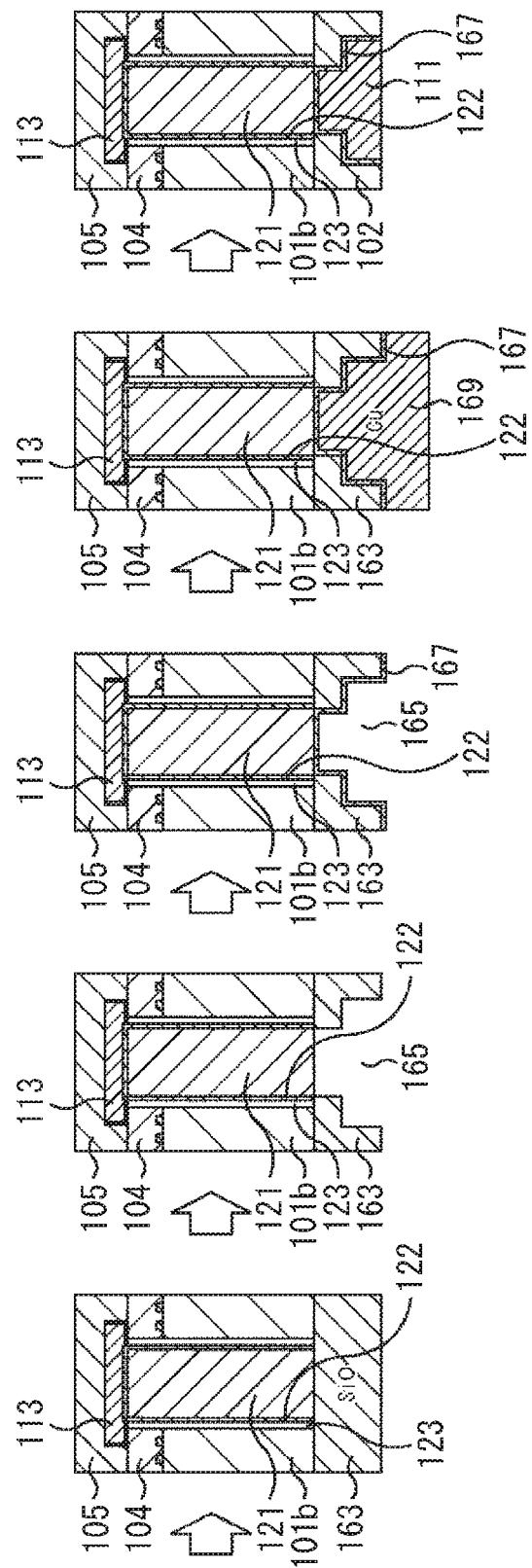
FIG. 15 is a diagram for explaining manufacturing of the through electrode.

Manufacture of the through electrode 81b illustrated in FIGS. 11 and 12 will be described with reference to FIGS. 13 to 15. The manufacturing process described with reference to FIGS. 13 to 15 includes similar steps to the manufacturing process described with reference to FIGS. 6 to 8, and therefore description of the similar steps is omitted.

Figure 6:
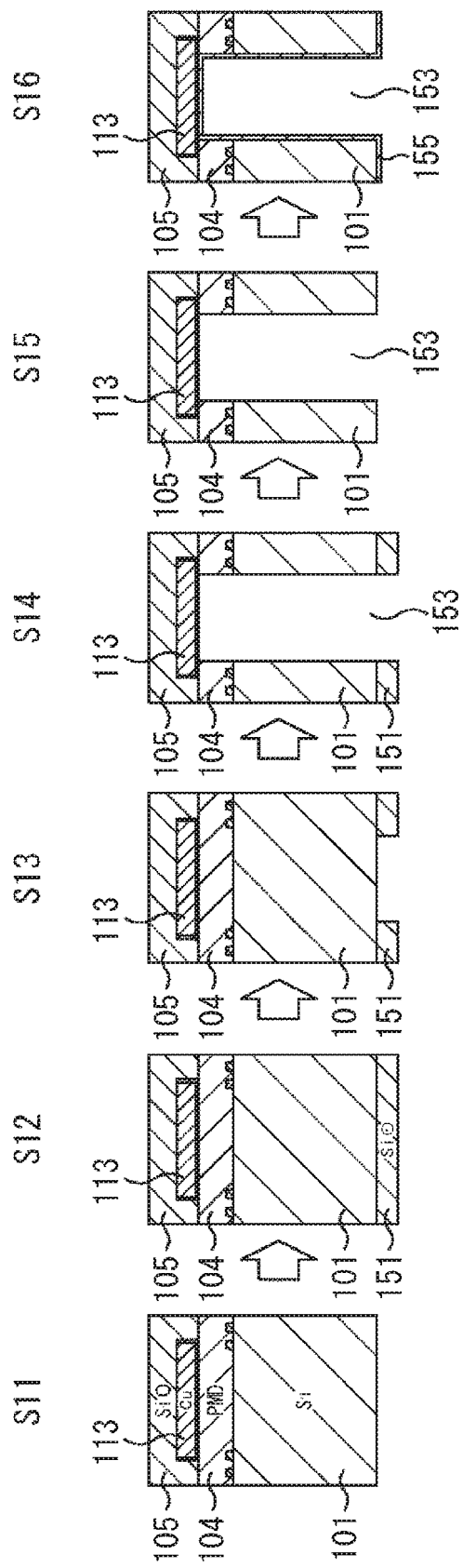
FIG. 6 is a diagram for explaining manufacturing of the through electrode.

Steps S101 to S105 are steps for forming the via 153 in the Si substrate 101b, and are performed in a similar manner to steps S11 to S15 (FIG. 6).

In step S106 (FIG. 14), a SiO film 157b is formed. In manufacturing the through electrode 81b, it is not necessary to form the SiC film 124, and therefore step S17 (FIG. 7) for forming the SiC film 155 corresponding to the SiC film 124 can be omitted.

In step S106, the SiO film 157b is formed on side surfaces of the via 153, an exposed surface of the AL pad 113, and a surface other than a portion where the via 153 is opened on a bottom surface of the Si substrate 101b. The SiO film 157b is a portion to be the hollow groove 123b by being removed in a later step.

Each of steps S106 to S116 (FIG. 15) can be performed in a similar manner to steps S17 to S27 (FIGS. 7 and 8) except that each of steps S106 to S116 is performed while the SiC film 155 is not formed, and therefore description thereof is omitted.

In this way, the through electrode 81b having the hollow groove 123b can be formed.

The through electrode 81b having the hollow groove 123b can also be manufactured by applying the step for performing processing from the upper surface of the Si substrate 101, described with reference to FIGS. 9 and 10. Also, in this case, the through electrode 81b can be manufactured through similar steps except that the step for forming the SiC film 155 corresponding to the SiC film 124 is omitted.

<Third Configuration of Through Electrode>

Another configuration of the through electrode 81 will be described.

Figure 16:
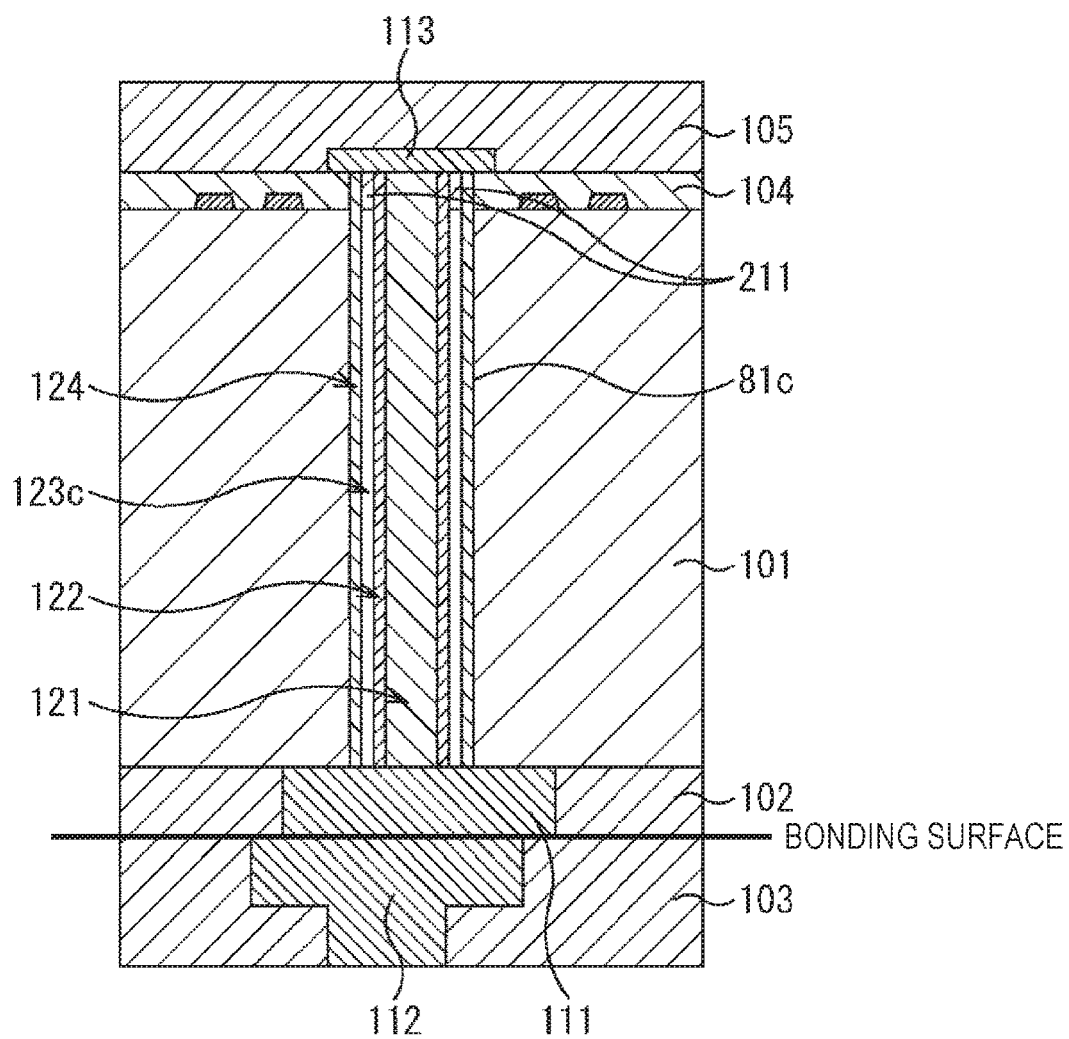
FIG. 16 is a cross-sectional view for explaining a third configuration of the through electrode.

FIG. 16 is a diagram for explaining a third configuration of the through electrode 81. A through electrode 81c illustrated in FIG. 16 is different from the through electrode 81 illustrated in FIG. 4 in that a hollow groove 123c includes a SiO film 211, and the other portions are similar. Therefore, the same reference numerals are given to the similar portions, and description thereof is omitted.

In the through electrode 81 illustrated in FIG. 4, the hollow groove 123 is formed up to the PMD 104. However, in the through electrode 81c illustrated in FIG. 16, the hollow groove 123c is formed up to the front of the PMD 104, and the SiO film 211 is formed in the PMD 104.

In other words, the hollow groove 123c is formed only on the side surfaces of the Si substrate 101. Moreover, in other words, a space between the through hole in which the through electrode 81c is formed and the PMD 104 is filled with an insulating material of SiO.

In this way, in a case where the through electrode 81c has a configuration that the PMD 104 includes the SiO film 211, by performing a basic manufacturing process similarly to the process for manufacturing the through electrode 81 having the first configuration, for example, the manufacturing process described with reference to FIGS. 6 to 8, the through electrode 81c can be manufactured.

In a case where the through electrode 81c is manufactured, in step S22 (FIG. 7), when the SiO film 157 is removed, etching is performed such that the SiO film 157 is left in the PMD 104, in other words, such that only the SiO film 157 in a portion to be the hollow groove 123c is removed.

For example, in step S22 (FIG. 7), in a case where the SiO film 157 is removed by wet etching, by adjusting the concentration of a solvent used for the etching, or by adjusting etching time, etching can be performed while the SiO film 157 is left in a desired portion.

Figure 9:
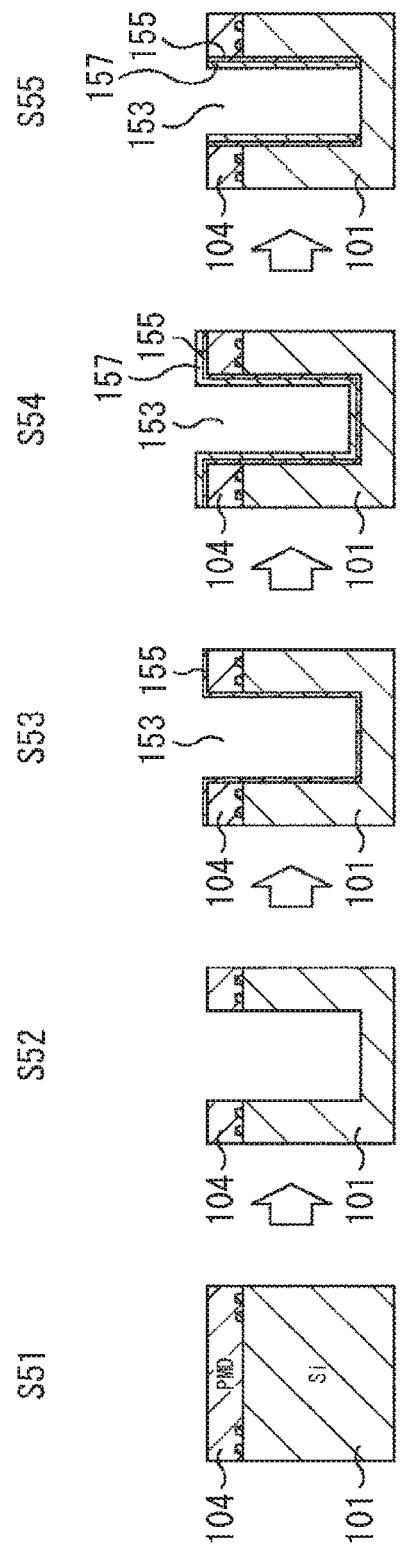
FIG. 9 is a diagram for explaining manufacturing of the through electrode.
Figure 10:
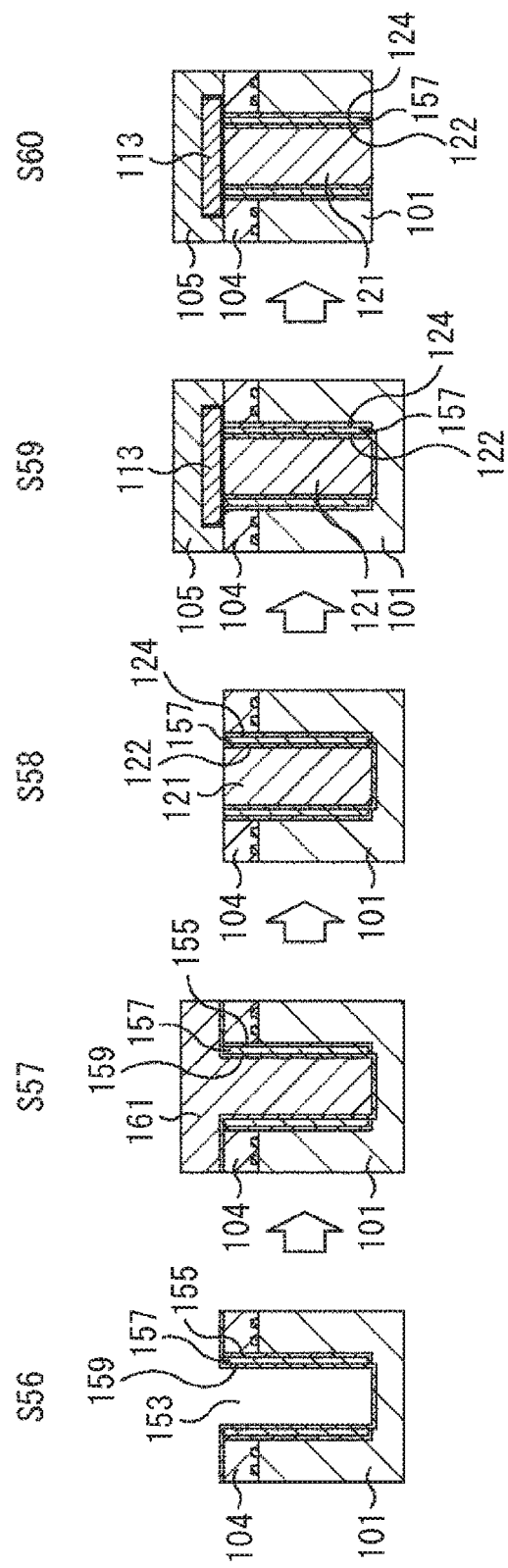
FIG. 10 is a diagram for explaining manufacturing of the through electrode.

Furthermore, even if the manufacturing process described with reference to FIGS. 9 and 10 is applied as the manufacturing process, the through electrode 81c having the third configuration can be manufactured.

Furthermore, similarly to the through electrode 81b having the second configuration, also on the through electrode 81c having the third configuration, the SiC film 124 does not have to be formed. In this case, the through electrode 81c on which the SiC film 124 is not formed can be manufactured by applying the manufacturing process illustrated in FIGS. 13 to 15.

<Fourth Configuration of Through Electrode>

A fourth configuration of the through electrode 81 will be described.

Figure 17:
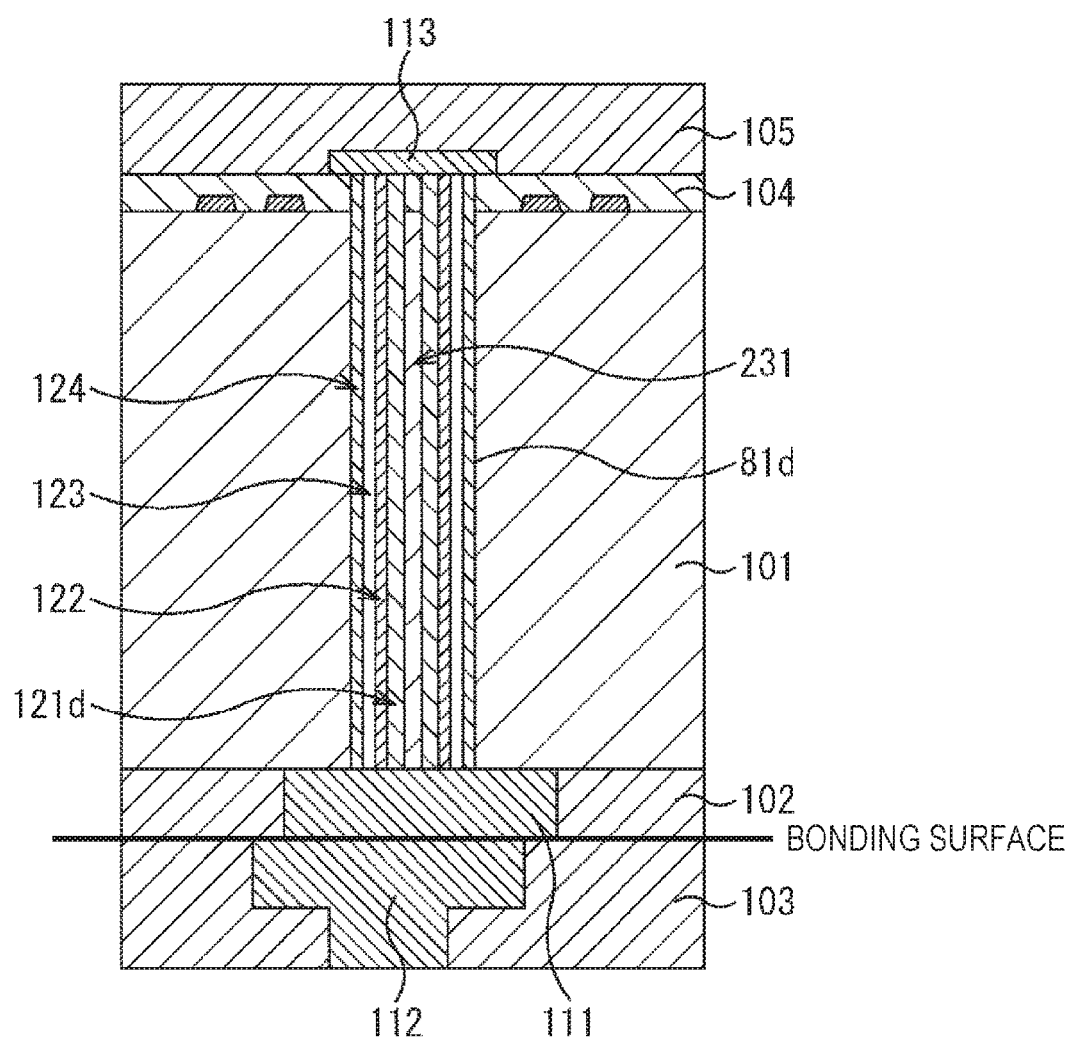
FIG. 17 is a cross-sectional view for explaining a fourth configuration of the through electrode.
Figure 18:
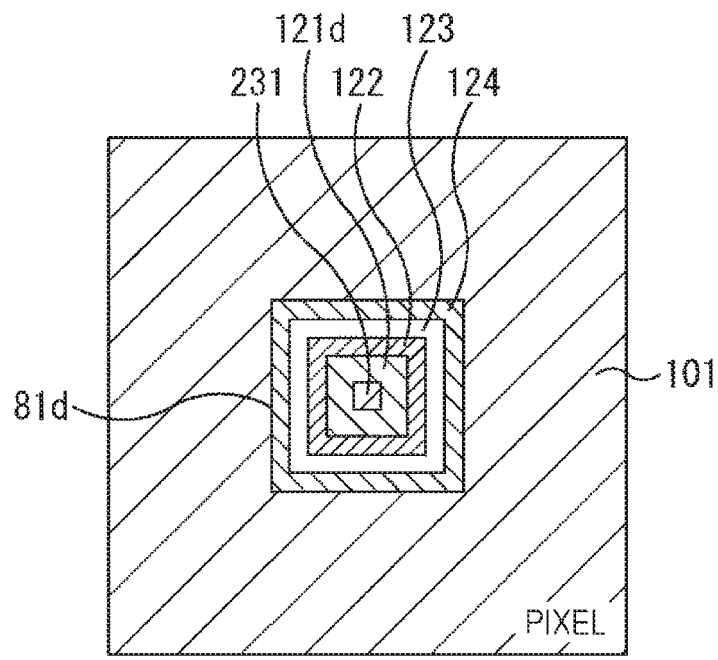
FIG. 18 is a plan view for explaining the fourth configuration of the through electrode.

FIGS. 17 and 18 are diagrams for explaining the fourth configuration of the through electrode 81. FIG. 17 is a vertical sectional view, and FIG. 18 is a horizontal plan view. A through electrode 81d illustrated in FIG. 17 (FIG. 18) is different from the through electrode 81 illustrated in FIG. 4 (FIG. 5) in that a pillar is formed in the electrode 121 (at the center of the electrode 121), and the other portions are similar. Therefore, the same reference numerals are given to the similar portions, and description thereof is omitted.

In the through electrode 81 illustrated in FIG. 4, the electrode 121 is formed at the center of the through electrode 81. Moreover, in the through electrode 81d illustrated in FIGS. 17 and 18, a pillar 231 is formed at the center of an electrode 121d. In other words, the pillar 231 is formed at the center of the through electrode 81d illustrated in FIGS. 17 and 18, and the electrode 121d is formed around the pillar 231.

As in the first to third configurations, the barrier metal 122 is formed around the electrode 121d, the hollow groove 123 is formed around the barrier metal 122, and the SiC film 124 is formed around the hollow groove 123 to form the through electrode 81d. That is, in this case, in the through electrode 81d, the electrode 121d, the barrier metal 122, the hollow groove 123, and the SiC film 124 are formed in a ring shape around the pillar 231.

The pillar 231 includes silicon (Si). That is, the pillar 231 includes the same material as the Si substrate 101 to form an integral structure.

In this way, in a case where the through electrode 81d has a configuration that a ring shape is formed around the pillar 231, by performing a basic manufacturing process similarly to the process for manufacturing the through electrode 81 having the first configuration, for example, the manufacturing process described with reference to FIGS. 6 to 8, the through electrode 81d can be manufactured.

For example, when the via 153 is formed in step S14 (FIG. 6), by performing patterning or etching such that the Si substrate 101 is left at the center of the via 153, a portion corresponding to the pillar 231 is formed. Thereafter, a portion around the pillar 231 is filled with a metal material to be the electrode 121d.

In this way, by forming the pillar 231 (leaving the Si substrate 101 in the via 153) and performing the subsequent steps, possibility of generation of a defect during manufacturing can be reduced.

For example, referring again to step S22 (FIG. 7), when the through electrode 81 having the first structure illustrated in FIG. 7 is manufactured, the SiO film 157 is removed, and the hollow groove 123 is formed. At this time, the electrode 121 may be inclined.

A periphery of the electrode 121 in step S22 is hollow, and only an upper portion of the electrode 121 is connected to the SiO layer 105 (AL pad 113). Such a state is unstable state for the electrode 121. For example, when an external force is applied, the electrode 121 may be inclined toward the hollow groove 123 side.

By forming the pillar 231, that is, by leaving the Si substrate 101, for example, even if an external force is applied, the electrode 121c can be prevented from being inclined toward the hollow groove 123 side.

The through electrode 81d can also be manufactured by applying the manufacturing process described with reference to FIGS. 9 and 10 as a manufacturing process.

Furthermore, similarly to the through electrode 81b having the second configuration, also on the through electrode 81d having the fourth configuration, the SiC film 124 does not have to be formed. In this case, the through electrode 81d on which the SiC film 124 is not formed can be manufactured by applying the manufacturing process illustrated in FIGS. 13 to 15.

<Fifth Configuration of Through Electrode>

A fifth configuration of the through electrode 81 will be described.

Figure 19:
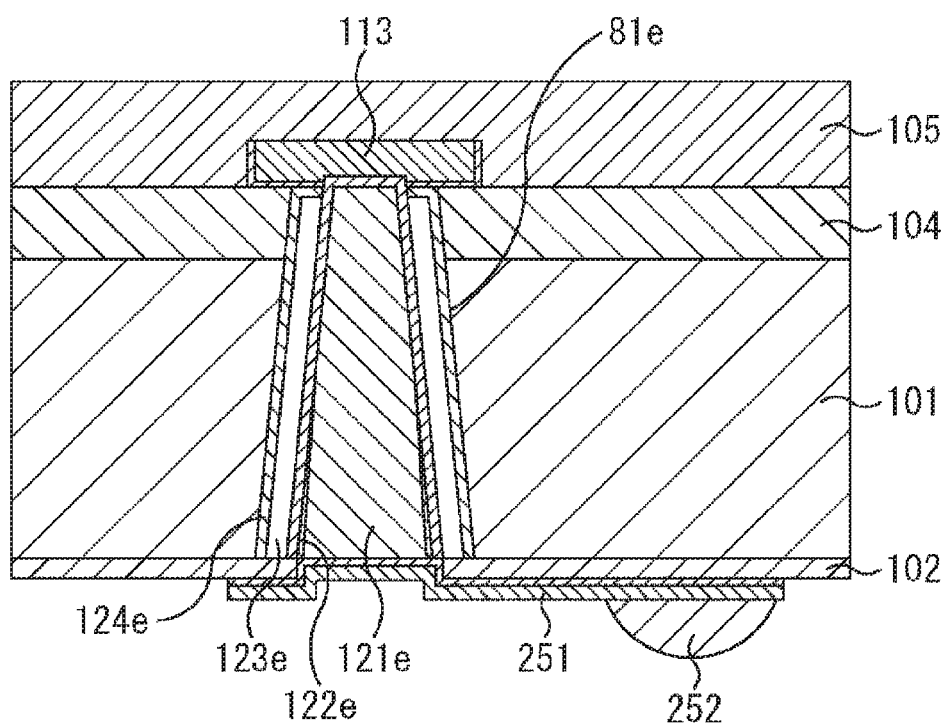
FIG. 19 is a cross-sectional view for explaining a fifth configuration of the through electrode.

FIG. 19 is a diagram for explaining the fifth configuration of the through electrode 81. The present technology can also be applied to a through electrode structure for removing bumps formed on a back surface side, and FIG. 19 illustrates a configuration example of a through electrode 81e in a case where the present technology is applied to such a through electrode structure for removing bumps.

Even in a case where the present technology is applied to the through electrode structure for removing bumps, a basic configuration thereof is, for example, similar to the through electrode 81 illustrated in FIG. 4. Therefore, similar reference numerals are given to the similar portions, and detailed description thereof is omitted.

In the through electrode 81e formed in the Si substrate 101, an electrode 121e, a barrier metal 122e, a hollow groove 123e, and a SiC film 124e are formed in this order from the center. The AL pad 113 is connected to an upper surface of the electrode 121e, and wiring 251 is connected to a lower surface thereof. In addition, the wiring 251 is connected to a bump 256.

In this way, the through electrode 81e including the hollow groove 123e can also be applied to the electrode connected to the bump 256.

<Sixth Configuration of Through Electrode>

A sixth configuration of the through electrode 81 will be described.

The present technology can also be applied to a pixel separation unit formed for light shielding between pixels, and FIG. 19 illustrates a configuration example in a case where the present technology is applied to such a pixel separation unit. In a case where the present technology is applied to the pixel separation unit, a function as an electrode is not necessarily required. Therefore, here, a portion corresponding to the through electrode 81 in the embodiment described above is referred to as a pixel separation unit 81f.

Figure 20:
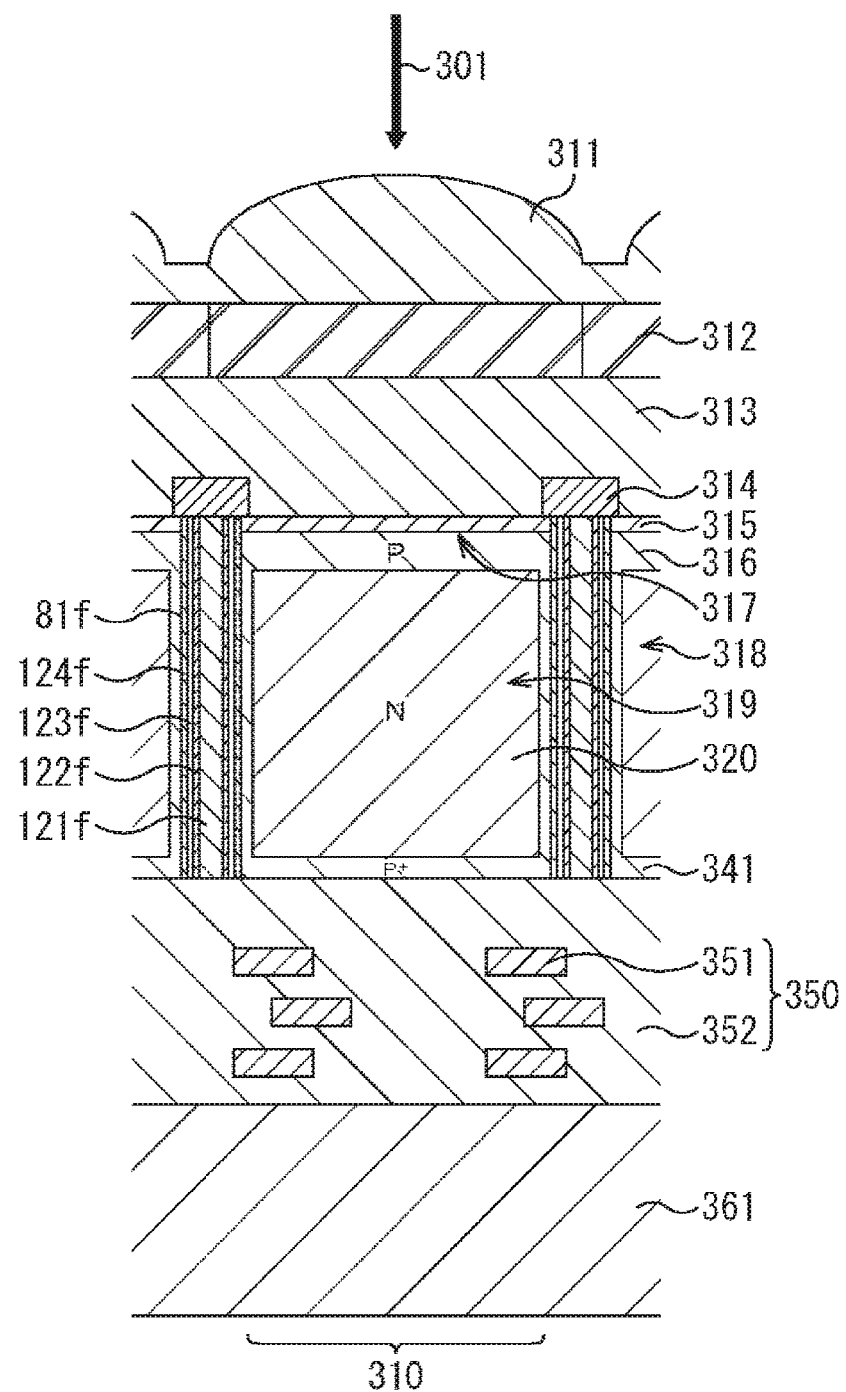
FIG. 20 is a cross-sectional view for explaining a sixth configuration of the through electrode.

FIG. 20 is a cross-sectional view of a pixel illustrating a configuration example of a pixel including the pixel separation unit 81f to which the present technology is applied. The pixels illustrated in FIG. 20 are arranged in an array in the pixel region 11 (FIG. 1).

Furthermore, each of the pixels can include the through electrode 81 described above and can be connected to another layer (substrate) via the through electrode 81. In a case where each of the pixels includes the through electrode 81, the through electrode 81 having any one of the first to fifth configurations described above can be applied to the through electrode 81.

A photodiode (PD) 319 constituting a pixel 310 receives incident light 301 incident from a back surface (upper surface in the drawing) side of a semiconductor substrate 318. Above the PD 319, a planarization film 313, a color filter (CF) 312, and a microlens 311 are disposed. In the PD 319, the incident light 301 sequentially incident via each part is received by a light receiving surface 317 to perform photoelectric conversion.

For example, in the PD 319, an n-type semiconductor region 320 is formed as a charge accumulation region for accumulating charges (electrons). In the PD 319, the n-type semiconductor region 320 is disposed in p-type semiconductor regions 316 and 341 of the semiconductor substrate 318. The p-type semiconductor region 341 having a higher impurity concentration than a back surface (upper surface) side is disposed on a front surface (lower surface) side of the semiconductor substrate 318 in the n-type semiconductor region 320. That is, the PD 319 has a hole-accumulation diode (HAD) structure, and the p-type semiconductor regions 316 and 341 are formed so as to suppress generation of a dark current at each interface between the upper surface side and the lower surface side of the n-type semiconductor region 320.

In the semiconductor substrate 318, the pixel separation unit 81f for electrically separating the plurality of pixels 310 from each other is disposed, and the PD 319 is disposed in a region partitioned by the pixel separation units 81f. In the drawing, in a case where pixels arranged in the pixel region 11 are viewed from an upper surface side, the pixel separation units 81f are formed, for example, in a lattice shape so as to be interposed between the plurality of pixels 310, and the PD 319 is formed in a region partitioned by the pixel separation units 81f.

In each PD 319, an anode is grounded. A signal charge (for example, an electron) accumulated in the PD 319 is read out via a transfer Tr (MOS FET) (not illustrated) and the like, and output to a vertical signal line (VSL) (not illustrated) as an electric signal.

A wiring layer 350 is disposed on a surface (lower surface) of the semiconductor substrate 318 opposite to a back surface (upper surface) where a light shielding film 314, the CF 312, the microlens 311, and the like are disposed.

The wiring layer 350 includes wiring 351 and an insulating layer 352, and is formed such that the wiring 351 is electrically connected to each element in the insulating layer 352. The wiring layer 350 is a so-called multilayered wiring layer and formed by alternately laminating an interlayer insulating film constituting the insulating layer 352 and the wiring 351 a plurality of times. Here, as the wiring 351, wiring to a Tr for reading out charges from the PD 319 such as a transfer Tr, and wiring such as a VSL are laminated via the insulating layer 352.

In the wiring layer 350, the through electrode 81 described above can be applied as a through electrode connecting the wiring 351.

A supporting substrate 361 is disposed on a surface of the wiring layer 350 opposite to the side on which the PD 319 is disposed. For example, a substrate including a silicon semiconductor having a thickness of several hundred μm is disposed as the supporting substrate 361.

The light shielding film 314 is disposed on a back surface (upper surface in the drawing) side of the semiconductor substrate 318.

The light shielding film 314 shields a part of the incident light 301 traveling from an upper side of the semiconductor substrate 318 to a lower side of the semiconductor substrate 318.

The light shielding film 314 is disposed above the pixel separation unit 81f disposed in the semiconductor substrate 318. Here, the light shielding film 314 is disposed on a back surface (upper surface) of the semiconductor substrate 318 so as to protrude in a convex shape via an insulating film 315 such as a silicon oxide film. In contrast, above the PD 319 disposed in the semiconductor substrate 318, the light shielding film 314 is not disposed such that the incident light 301 is incident on the PD 319, and is opened.

That is, in the drawing, in a case where pixels in the pixel region 11 are viewed from an upper surface side, the planar shape of the light shielding film 314 is a lattice shape, and an opening through which the incident light 301 passes toward the light receiving surface 317 is formed.

The light shielding film 314 includes a light shielding material that shields light. For example, the light shielding film 314 is formed by sequentially laminating a titanium (Ti) film and a tungsten (W) film. In addition, the light shielding film 314 can be formed by sequentially laminating a titanium nitride (TiN) film and a tungsten (W) film, for example. Furthermore, the light shielding film 314 may be covered with nitride (N) or the like.

The light shielding film 314 is covered with the planarization film 313. The planarization film 313 is formed using an insulating material that transmits light.

The pixel separation unit 81f can have a similar configuration to the through electrode 81 described above. That is, in this case, a metal material 121f corresponding to the electrode 121 is formed at the center of the pixel separation unit 81f.

The pixel separation unit 81f may be filled with a light shielding member, for example, a metal material, in order to have not only a separating function but also a function of shielding stray light from an adjacent pixel.

Here, the description will be continued assuming that a light shielding member such as a metal material is filled, and the metal material is referred to as the metal material 121f. A barrier metal 122f, a hollow groove 123f, and a SiC film 124f are formed in this order around the metal material 121f formed at the center of the pixel separation unit 81f.

In the pixel separation unit 81f, the barrier metal 122f does not have to be formed. Furthermore, in the pixel separation unit 81f, the SiC film 124f does not have to be formed.

The metal material 121f may be connected to the light shielding film 314, in other words, may be integrally formed therewith. The metal material 121f and the light shielding film 314 can be formed using the same metal material, for example, a material such as copper or tungsten, and can be formed at the same time during manufacturing.

In this way, the present technology can also be applied to the pixel separation unit 81f having the hollow groove 123f.

<Seventh Configuration of Through Electrode>

A seventh configuration of the through electrode 81 will be described.

Figure 21:
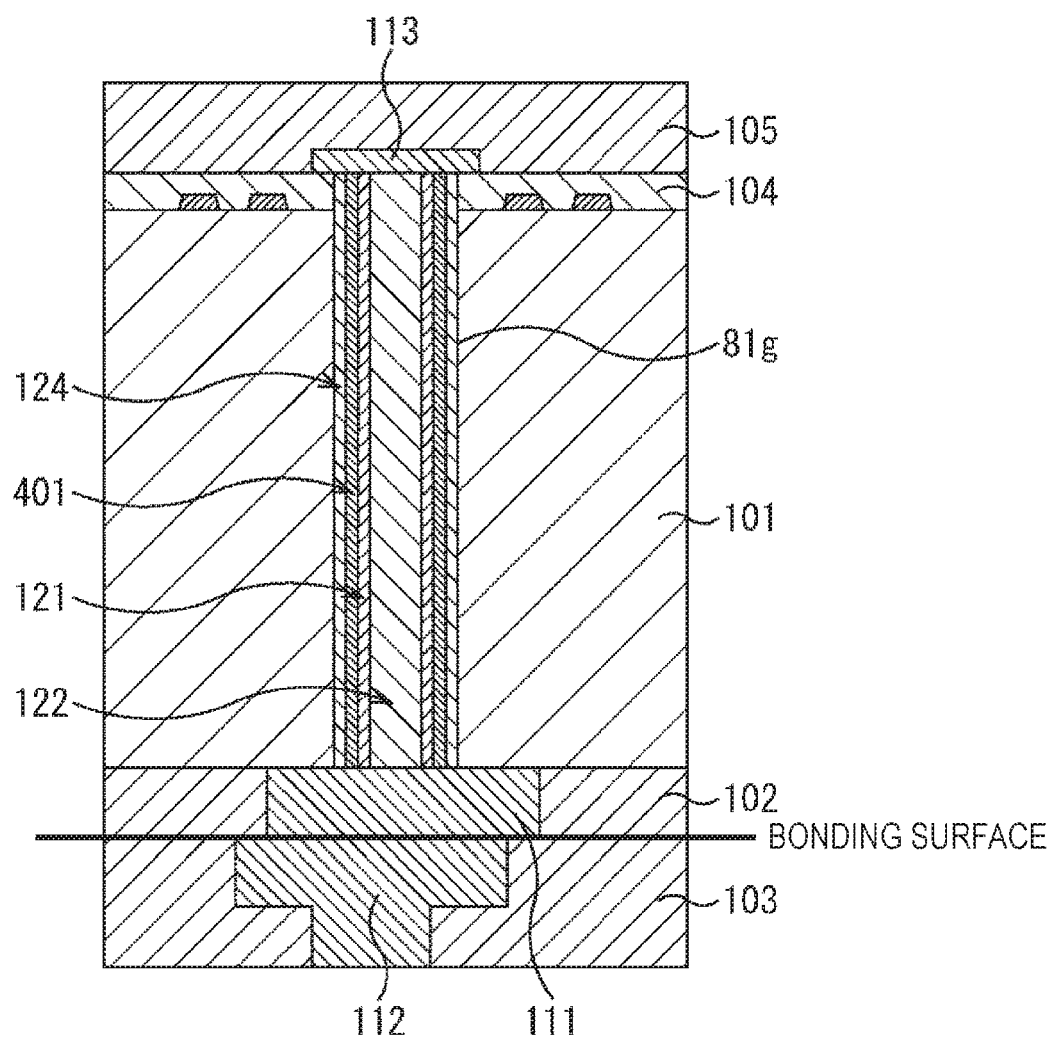
FIG. 21 is a cross-sectional view for explaining a seventh configuration of the through electrode.

FIG. 21 is a diagram for explaining the seventh configuration of the through electrode 81. A through electrode 81g illustrated in FIG. 21 is different from the through electrode 81 illustrated in FIG. 4 in that a relieving layer 401 is formed in the portion where the hollow groove 123 is formed in FIG. 4, and the other portions are similar. Therefore, the same reference numerals are given to the similar portions, and description thereof is omitted.

In the through electrode 81g illustrated in FIG. 21, the electrode 121, the barrier metal 122, the relieving layer 401, and the SiC film 124 are formed in this order from the center. The relieving layer 401 is disposed as a layer for relieving a stress that may be generated due to a difference in coefficient of thermal expansion, and corresponds to the hollow groove 123 described above.

The relieving layer 401 includes a material that can relieve a stress. Examples of a material for forming the relieving layer 401 include a material that absorbs a stress when the stress is applied and returns to its original shape when the stress disappears (for example, a material that is an elastic body).

Furthermore, the relieving layer 401 may include a low dielectric material so as to have insulating performance. The relieving layer 401 can be, for example, a layer using porous silica as a material.

The first to seventh configurations described above can be applied singly, of course, and can also be applied in combination thereof.

According to the present technology, an electrode isolated from silicon can be formed by forming a hollow groove in a silicon substrate. This can reduce an influence of a stress when the stress is generated.

Reduction in influence of the stress can prevent deformation of the shape due to the stress. For example, when chips are laminated, wiring positions of the chips can be prevented from being shifted. Furthermore, reduction in influence of the stress also reduces an influence on device characteristics, and can relieve a keep out zone (KOZ).

Furthermore, insulating performance of a portion that needs insulation can also be improved. Therefore, capacitance between through electrodes (between wirings) can be reduced. Furthermore, an influence on a transistor or the like disposed near a hollow groove can be reduced, and performance as a device can also be improved.

<Application Example to Endoscopic Surgical System>

The technology according to the present disclosure (the present technology) can be applied to various products. For example, the technology according to the present disclosure may be applied to an endoscopic surgical system.

Figure 22:
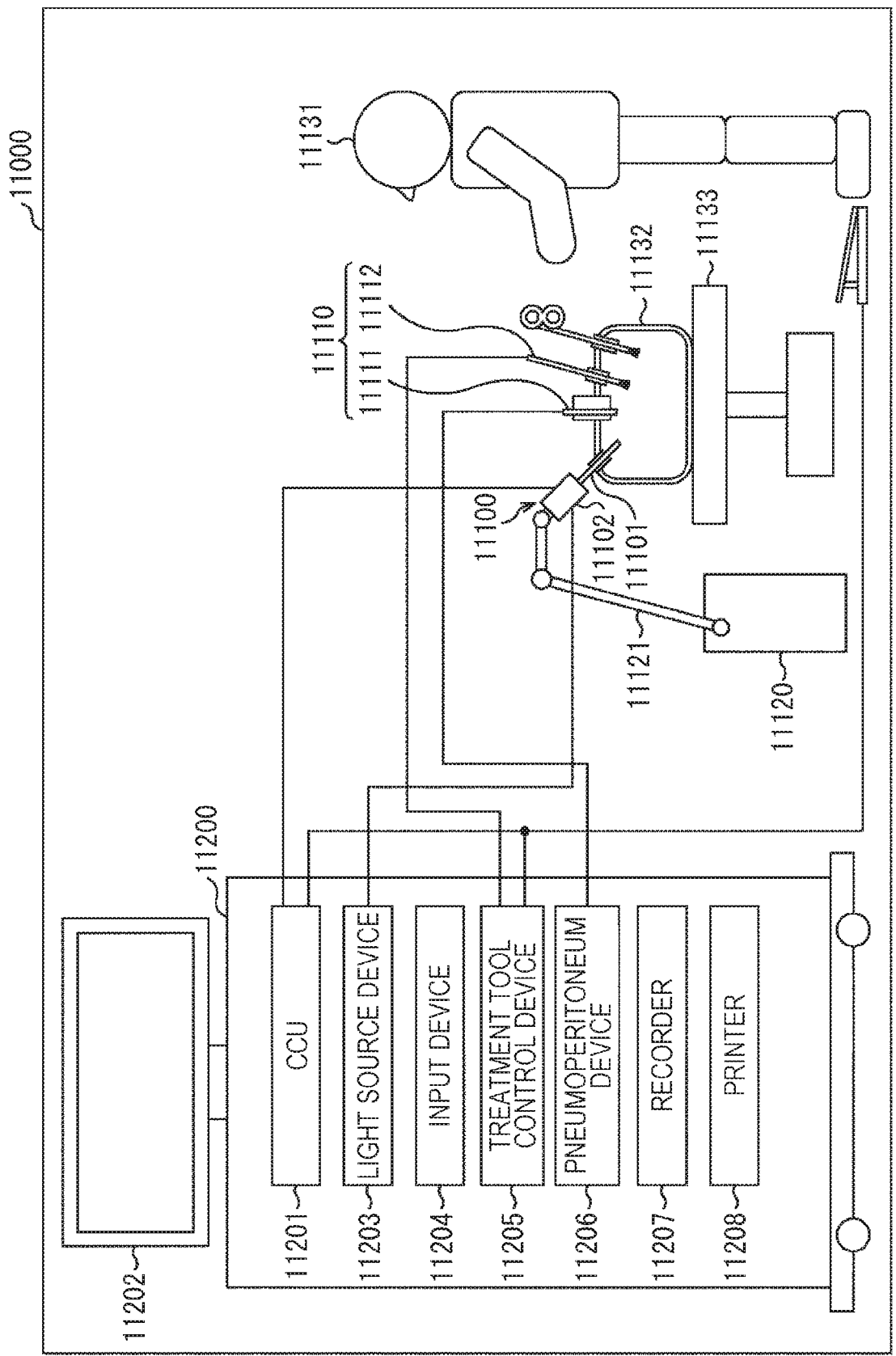
FIG. 22 is a diagram illustrating an example of a schematic configuration of an endoscopic surgical system.

FIG. 22 is a diagram illustrating an example of a schematic configuration of an endoscopic surgical system to which the technology according to the present disclosure (the present technology) can be applied.

FIG. 22 illustrates a situation in which a surgeon (physician) 11131 is performing surgery on a patient 11132 on a patient bed 11133 using an endoscopic surgical system 11000. As illustrated in the drawing, the endoscopic surgical system 11000 includes an endoscope 11100, another surgical tool 11110 such as a pneumoperitoneum tube 11111 or an energy treatment tool 11112, a support arm device 11120 for supporting the endoscope 11100, and a cart 11200 on which various devices for endoscopic surgery are mounted.

The endoscope 11100 includes a lens barrel 11101 to be inserted into a body cavity of the patient 11132 in a region of a predetermined length from a tip thereof, and a camera head 11102 connected to a proximal end of the lens barrel 11101. In the illustrated example, the endoscope 11100 configured as a so-called rigid mirror including the rigid lens barrel 11101 is illustrated, but the endoscope 11100 may be configured as a so-called flexible mirror including a flexible lens barrel.

At the tip of the lens barrel 11101, an opening into which an objective lens is fitted is disposed. A light source device 11203 is connected to the endoscope 11100. Light generated by the light source device 11203 is guided to the tip of the lens barrel by a light guide extended inside the lens barrel 11101, and is emitted toward an observation target in a body cavity of the patient 11132 via the objective lens. Note that the endoscope 11100 may be a forward-viewing endoscope, an oblique-viewing endoscope, or a side-viewing endoscope.

An optical system and an imaging element are disposed inside the camera head 11102. Reflected light (observation light) from an observation target is converged on the imaging element by the optical system. The observation light is photoelectrically converted by the imaging element, and an electric signal corresponding to the observation light, that is, an image signal corresponding to an observation image is generated. The image signal is transmitted as RAW data to a camera control unit (CCU) 11201.

The CCU 11201 includes a central processing unit (CPU), a graphics processing unit (GPU), and the like, and integrally controls operations of the endoscope 11100 and the display device 11202. Moreover, the CCU 11201 receives an image signal from the camera head 11102, and performs, on the image signal, various image processing for displaying an image based on the image signal, such as development processing (demosaic processing), for example.

The display device 11202 displays an image based on an image signal subjected to image processing by the CCU 11201 under the control of the CCU 11201.

The light source device 11203 includes a light source such as a light emitting diode (LED), for example, and supplies irradiation light for imaging a surgical site or the like to the endoscope 11100.

An input device 11204 is an input interface to the endoscopic surgical system 11000. A user can input various kinds of information and instructions to the endoscopic surgical system 11000 via the input device 11204. For example, the user inputs an instruction or the like to change imaging conditions (type of irradiation light, magnification, focal length, and the like) by the endoscope 11100.

A treatment tool control device 11205 controls driving of the energy treatment tool 11112 for cauterizing and cutting a tissue, sealing a blood vessel, or the like. A pneumoperitoneum device 11206 feeds a gas into a body cavity via the pneumoperitoneum tube 11111 in order to inflate the body cavity of the patient 11132 for the purpose of securing a field of view by the endoscope 11100 and securing a working space of a surgeon. A recorder 11207 is a device capable of recording various kinds of information regarding surgery. A printer 11208 is a device capable of printing various kinds of information regarding surgery in various formats such as a text, an image, and a graph.

Note that the light source device 11203 for supplying irradiation light used for imaging a surgical site to the endoscope 11100 may include an LED, a laser light source, or a white light source constituted by a combination thereof, for example. In a case where the white light source is constituted by a combination of RGB laser light sources, the output intensity and the output timing of each color (each wavelength) can be controlled with high precision, and therefore adjustment of a white balance of an imaged image can be performed by the light source device 11203. Furthermore, in this case, by irradiating an observation target with laser light from each of the RGB laser light sources in a time division manner and controlling driving of an imaging element of the camera head 11102 in synchronization with the irradiation timing, it is also possible to image an image corresponding to each of RGB in a time division manner. According to this method, a color image can be obtained without disposing a color filter in the imaging element.

Furthermore, driving of the light source device 11203 may be controlled so as to change the intensity of light output at predetermined time intervals. By controlling driving of the imaging element of the camera head 11102 in synchronization with the timing of the change of the intensity of the light to acquire an image in a time division manner and synthesizing the image, a high dynamic range image without so-called blocked up shadows or blown out highlights can be generated.

Furthermore, the light source device 11203 may be configured so as to be able to supply light in a predetermined wavelength band corresponding to special light observation. In the special light observation, for example, by irradiation with light in a narrower band than irradiation light (in other words, white light) at the time of ordinary observation using wavelength dependency of light absorption in a body tissue, a predetermined tissue such as a blood vessel of a mucosal surface layer is imaged at a high contrast, that is, so-called narrow band imaging is performed. Alternatively, in the special light observation, fluorescence observation for obtaining an image by fluorescence generated by irradiation with excitation light may be performed. In the fluorescence observation, it is possible to observe fluorescence from a body tissue (autofluorescence observation) by irradiating the body tissue with excitation light, or to obtain a fluorescent image by injecting a reagent such as indocyanine green (ICG) into a body tissue and irradiating the body tissue with excitation light corresponding to a fluorescence wavelength of the reagent, for example. The light source device 11203 can be configured so as to be able to supply narrow band light and/or excitation light corresponding to such special light observation.

Figure 23:
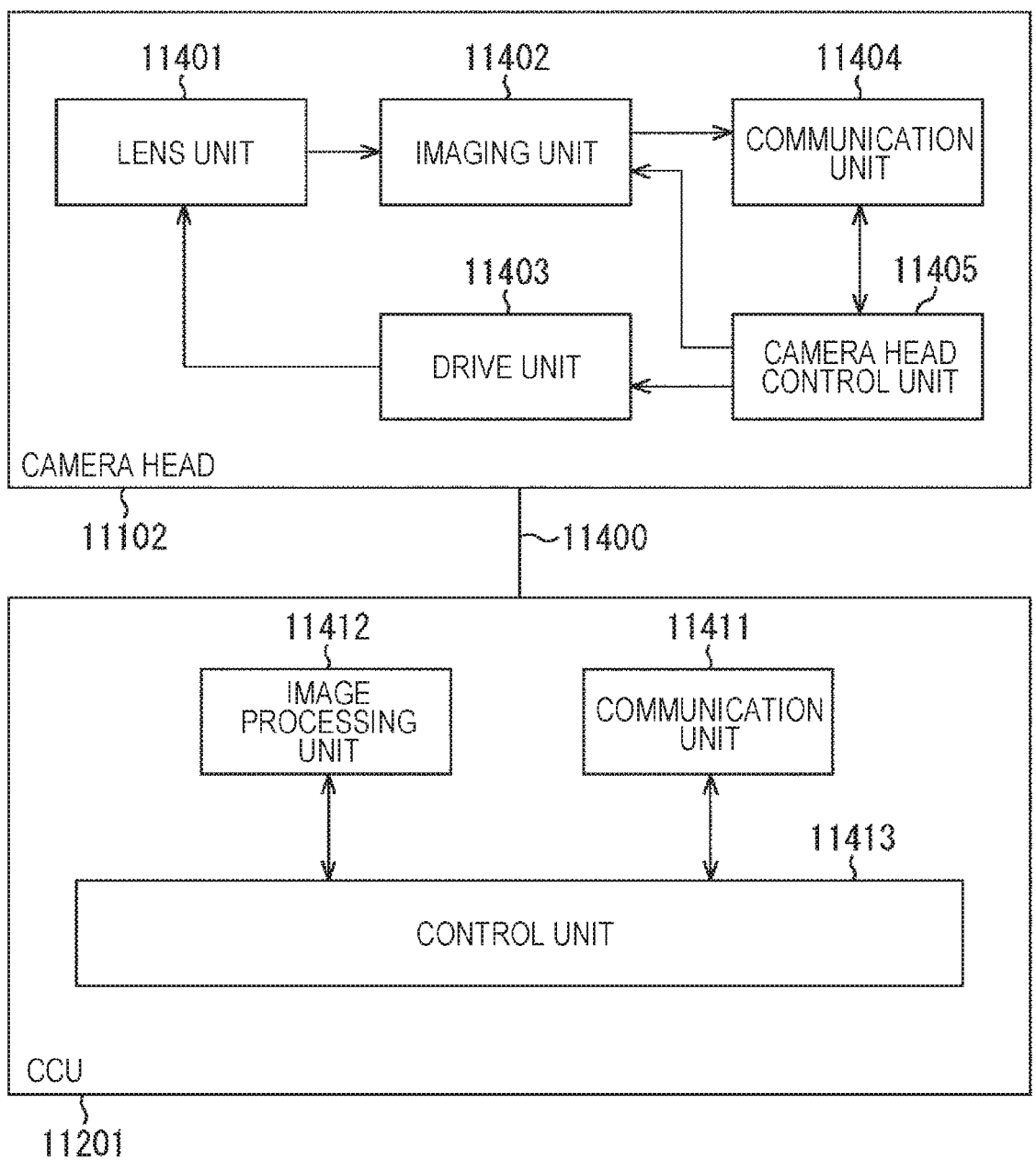
FIG. 23 is a block diagram illustrating examples of functional configurations of a camera head and a CCU.

FIG. 23 is a block diagram illustrating examples of functional configurations of the camera head 11102 and the CCU 11201 illustrated in FIG. 22.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system disposed at a connecting portion with the lens barrel 11101. Observation light taken in from a tip of the lens barrel 11101 is guided to the camera head 11102 and is incident on the lens unit 11401. The lens unit 11401 includes a combination of a plurality of lenses including a zoom lens and a focus lens.

The imaging unit 11402 may include one imaging element (so-called single plate type) or a plurality of imaging elements (so-called multiplate type). In a case where the imaging unit 11402 includes multiplate type imaging elements, for example, an image signal corresponding to each of RGB may be generated by each imaging element, and a color image may be obtained by synthesizing these image signals. Alternatively, the imaging unit 11402 may include a pair of imaging elements for acquiring an image signal for each of the right eye and the left eye corresponding to three-dimensional (3D) display. By performing the 3D display, the surgeon 11131 can grasp the depth of a living tissue in a surgical site more accurately. Note that in a case where the imaging unit 11402 includes multiplate type imaging elements, a plurality of lens units 11401 can be disposed corresponding to the respective imaging elements.

Furthermore, the imaging unit 11402 is not necessarily disposed in the camera head 11102. For example, the imaging unit 11402 may be disposed just behind an objective lens inside the lens barrel 11101.

The drive unit 11403 includes an actuator, and moves a zoom lens and a focus lens of the lens unit 11401 by a predetermined distance along an optical axis under control of the camera head control unit 11405. Therefore, the magnification and the focus of an image imaged by the imaging unit 11402 can be appropriately adjusted.

The communication unit 11404 includes a communication device for transmitting and receiving various kinds of information to and from the CCU 11201. The communication unit 11404 transmits an image signal obtained from the imaging unit 11402 as RAW data to the CCU 11201 via the transmission cable 11400.

Furthermore, the communication unit 11404 receives a control signal for controlling driving of the camera head 11102 from the CCU 11201, and supplies the control signal to the camera head control unit 11405. The control signal includes information regarding imaging conditions such as information indicating designation of a frame rate of an imaged image, information indicating designation of an exposure value at the time of imaging, and/or information indicating designation of the magnification and the focus of an imaged image, for example.

Note that the imaging conditions such as the above-described frame rate, exposure value, magnification, and focus may be appropriately designated by a user, or may be automatically set by the control unit 11413 of the CCU 11201 on the basis of an acquired image signal. In the latter case, the endoscope 11100 has a so-called auto exposure (AE) function, a so-called auto focus (AF) function, and a so-called auto white balance (AWB) function.

The camera head control unit 11405 controls driving of the camera head 11102 on the basis of a control signal from the CCU 11201 received via the communication unit 11404.

The communication unit 11411 includes a communication device for transmitting and receiving various kinds of information to and from the camera head 11102. The communication unit 11411 receives an image signal transmitted from the camera head 11102 via the transmission cable 11400.

Furthermore, the communication unit 11411 transmits a control signal for controlling driving of the camera head 11102 to the camera head 11102. The image signal and the control signal can be transmitted by electric communication, optical communication, or the like.

The image processing unit 11412 performs various kinds of image processing on the image signal which is RAW data transmitted from the camera head 11102.

The control unit 11413 performs various kinds of control concerning imaging of a surgical site or the like by the endoscope 11100 and display of an imaged image obtained by imaging a surgical site or the like. For example, the control unit 11413 generates a control signal for controlling driving of the camera head 11102.

Furthermore, the control unit 11413 causes the display device 11202 to display an imaged image of a surgical site or the like on the basis of an image signal subjected to image processing by the image processing unit 11412. In this case, the control unit 11413 may recognize various objects in the imaged image using various image recognition techniques. For example, by detecting the shape, color, and the like of an edge of an object included in the imaged image, the control unit 11413 can recognize a surgical tool such as forceps, a specific living body part, bleeding, a mist at the time of using the energy treatment tool 11112, and the like.

When the display device 11202 displays the imaged image, the control unit 11413 may cause the display device 11202 to superimpose and display various kinds of surgical support information on the image of the surgical site using the recognition result. The surgical support information is superimposed and displayed, and presented to the surgeon 11131. This makes it possible to reduce a burden on the surgeon 11131 and makes it possible for the surgeon 11131 to reliably perform surgery.

The transmission cable 11400 connecting the camera head 11102 to the CCU 11201 is an electric signal cable corresponding to communication of an electric signal, an optical fiber corresponding to optical communication, or a composite cable thereof.

Here, in the illustrated example, communication is performed by wire using the transmission cable 11400, but communication between the camera head 11102 and the CCU 11201 may be performed wirelessly.

Note that the endoscopic surgical system has been described as an example here. However, the technology according to the present disclosure may also be applied to, for example, a microscopic surgery system or the like.

<Application Example to Mobile Body>

The technology according to the present disclosure (the present technology) can be applied to various products. For example, the technology according to the present disclosure may be achieved as an apparatus mounted on any type of mobile body such as an automobile, an electric vehicle, a hybrid electric vehicle, a motorcycle, a bicycle, a personal mobility, an airplane, a drone, a ship, or a robot.

Figure 24:
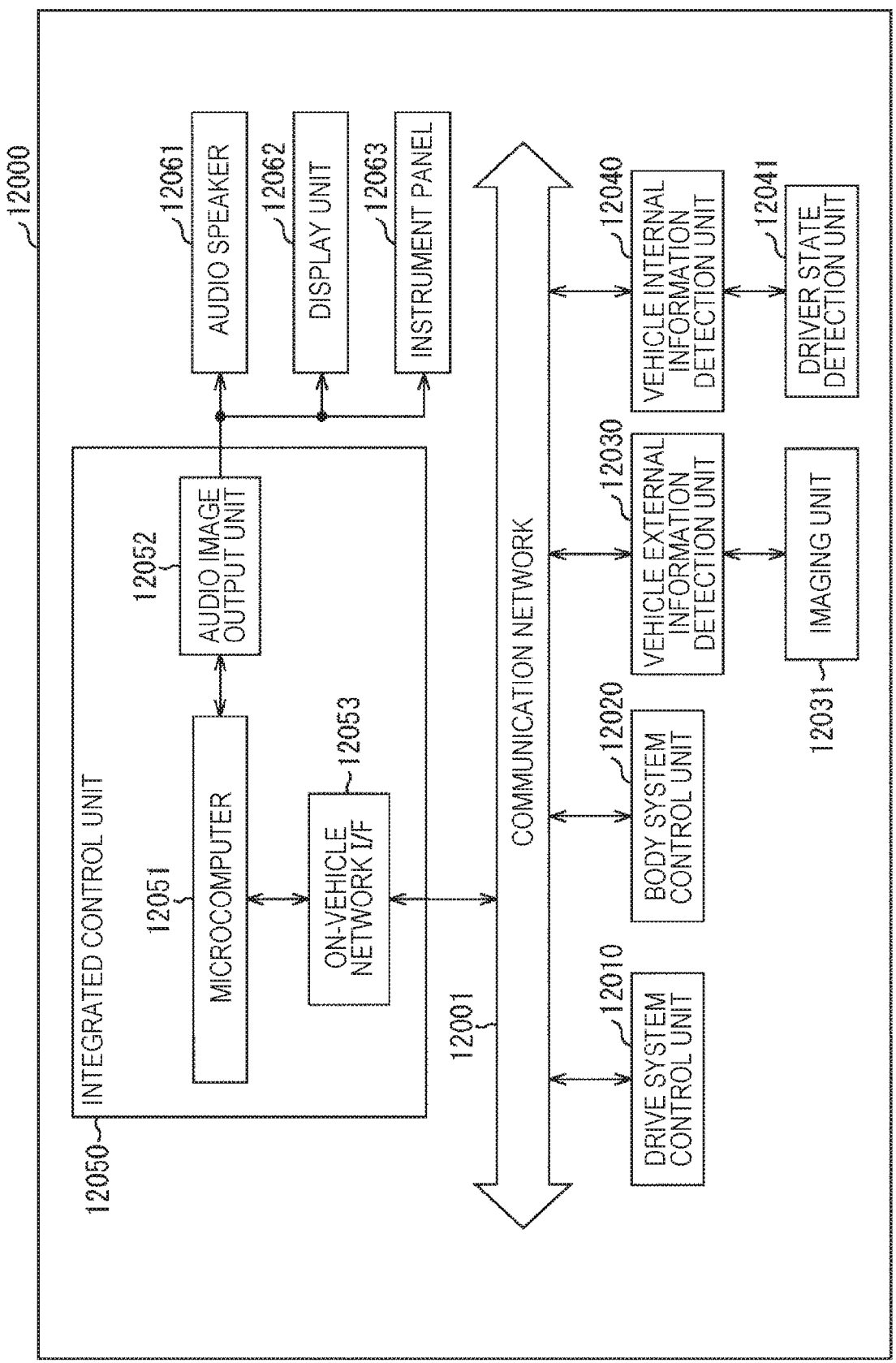
FIG. 24 is a block diagram illustrating an example of a schematic configuration of a vehicle control system.

FIG. 24 is a block diagram illustrating an example of a schematic configuration of a vehicle control system which is an example of a mobile body control system to which the technology according to the present disclosure can be applied.

A vehicle control system 12000 includes a plurality of electronic control units connected to one another via a communication network 12001. In the example illustrated in FIG. 24, the vehicle control system 12000 includes a drive system control unit 12010, a body system control unit 12020, a vehicle external information detection unit 12030, a vehicle internal information detection unit 12040, and an integrated control unit 12050. Furthermore, as a functional configuration of the integrated control unit 12050, a microcomputer 12051, an audio image output unit 12052, and an on-vehicle network interface (I/F) 12053 are illustrated.

The drive system control unit 12010 controls an operation of a device related to a drive system of a vehicle according to various programs. For example, the drive system control unit 12010 functions as a control device of a driving force generating device for generating a driving force of a vehicle such as an internal combustion engine or a driving motor, a driving force transmitting mechanism for transmitting a driving force to wheels, a steering mechanism for adjusting a rudder angle of a vehicle, a braking device for generating a braking force of a vehicle, or the like.

The body system control unit 12020 controls operations of various devices mounted on a vehicle body according to various programs. For example, the body system control unit 12020 functions as a control device of a keyless entry system, a smart key system, a power window device, or various lamps such as a head lamp, a back lamp, a brake lamp, a turn indicator, and a fog lamp. In this case, to the body system control unit 12020, a radio wave transmitted from a portable device substituted for a key or signals of various switches can be input. The body system control unit 12020 receives input of the radio wave or signals and controls a door lock device, a power window device, a lamp, and the like of a vehicle.

The vehicle external information detection unit 12030 detects information outside a vehicle on which the vehicle control system 12000 is mounted. For example, to the vehicle external information detection unit 12030, an imaging unit 12031 is connected. The vehicle external information detection unit 12030 causes the imaging unit 12031 to image an image outside a vehicle and receives an imaged image. The vehicle external information detection unit 12030 may perform object detection processing or distance detection processing of a person, a car, an obstacle, a sign, a character on a road surface, or the like on the basis of the received image.

The imaging unit 12031 is a light sensor for receiving light and outputting an electric signal corresponding to the amount of light received. The imaging unit 12031 can output an electric signal as an image or output the electric signal as distance measurement information. Furthermore, the light received by the imaging unit 12031 may be visible light or invisible light such as infrared light.

The vehicle internal information detection unit 12040 detects information inside a vehicle. To the vehicle internal information detection unit 12040, for example, a driver state detection unit 12041 for detecting the state of a driver is connected. The driver state detection unit 12041 includes, for example, a camera for imaging a driver. The vehicle internal information detection unit 12040 may calculate the degree of fatigue or the degree of concentration of a driver or may determine whether the driver is dozing off on the basis of detection information input from the driver state detection unit 12041.

The microcomputer 12051 can calculate a control target value of a driving force generating device, a steering mechanism, or a braking device on the basis of information inside and outside a vehicle, acquired by the vehicle external information detection unit 12030 or the vehicle internal information detection unit 12040, and can output a control command to the drive system control unit 12010. For example, the microcomputer 12051 can perform cooperative control aiming at realizing a function of advanced driver assistance system (ADAS) including collision avoidance or impact mitigation of a vehicle, following travel based on inter-vehicle distance, vehicle speed maintenance travel, vehicle collision warning, vehicle lane departure warning, and the like.

Furthermore, the microcomputer 12051 can perform cooperative control aiming at, for example, automatic driving that autonomously travels without depending on driver's operation by controlling a driving force generating device, a steering mechanism, a braking device, or the like on the basis of information around a vehicle, acquired by the vehicle external information detection unit 12030 or the vehicle internal information detection unit 12040.

Furthermore, the microcomputer 12051 can output a control command to the body system control unit 12030 on the basis of vehicle external information acquired by the vehicle external information detection unit 12030. For example, the microcomputer 12051 can perform cooperative control aiming at antiglare such as switching from high beam to low beam by controlling a headlamp according to the position of a preceding vehicle or an oncoming vehicle detected by the vehicle external information detection unit 12030.

The audio image output unit 12052 transmits at least one of an audio output signal or an image output signal to an output device capable of visually or audibly notifying a passenger of a vehicle or the outside of the vehicle of information. In the example of FIG. 24, as the output device, an audio speaker 12061, a display unit 12062, and an instrument panel 12063 are illustrated. The display unit 12062 may include an on-board display and/or a head-up display, for example.

Figure 25:
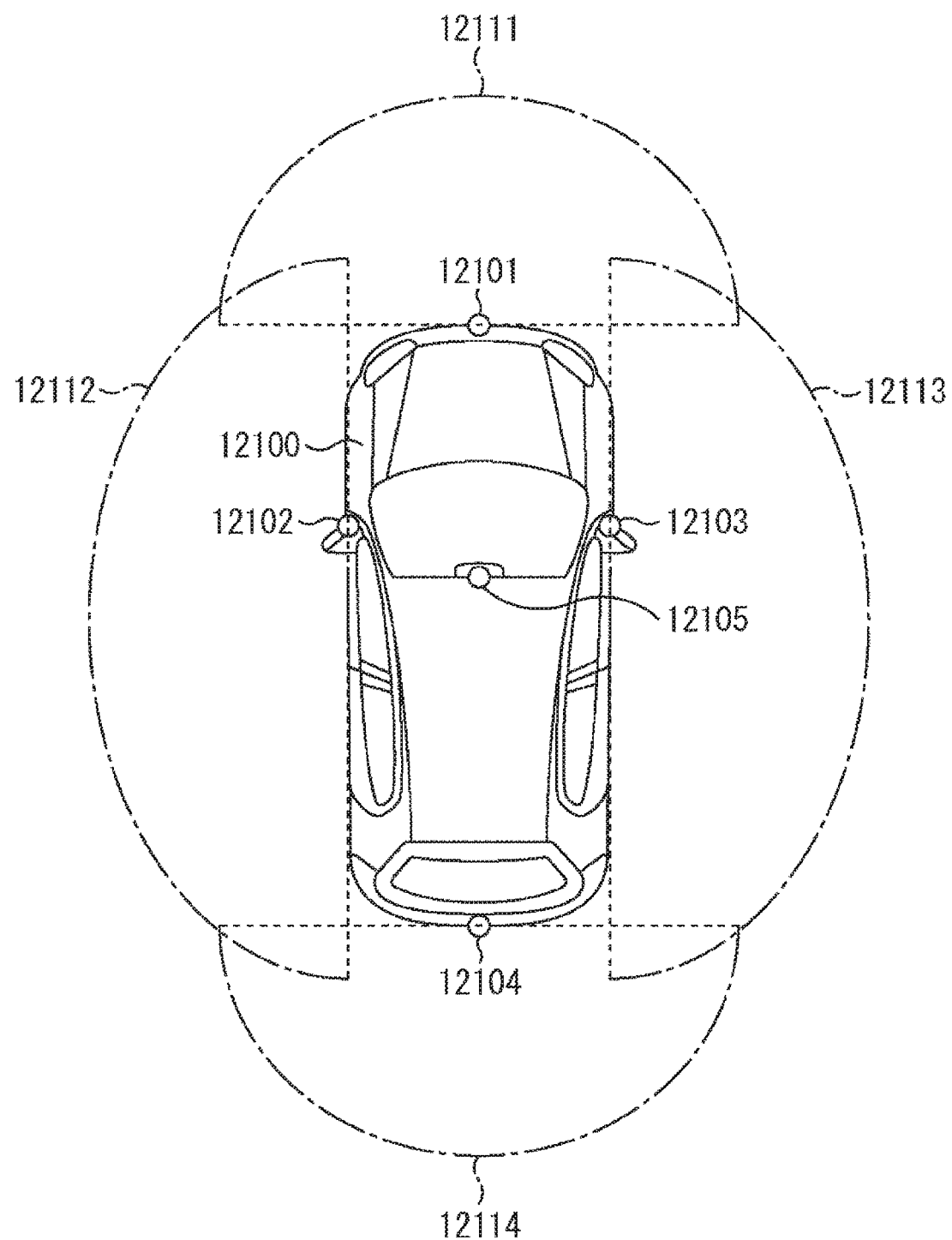
FIG. 25 is an explanatory diagram illustrating examples of installation positions of a vehicle external information detection unit and an imaging unit.

FIG. 25 is a diagram illustrating an example of an installation position of the imaging unit 12031.

In FIG. 25, as the imaging unit 12031, imaging units 12101, 12102, 12103, 12104, and 12105 are included.

The imaging units 12101, 12102, 12103, 12104, and 12105 are disposed, for example, in a front nose, a side mirror, a rear bumper, and a back door of the vehicle 12100, in an upper portion of a front glass in a passenger compartment, and the like. The imaging unit 12101 disposed in a front nose and the imaging unit 12105 disposed in an upper portion of a front glass in a passenger compartment mainly acquire images in front of the vehicle 12100. The imaging units 12102 and 12103 disposed in side mirrors mainly acquire images on sides of the vehicle 12100. The imaging unit 12104 disposed in a rear bumper or a back door mainly acquires an image behind the vehicle 12100. The imaging unit 12105 disposed in an upper portion of a front glass in a passenger compartment is mainly used for detecting a preceding vehicle, a pedestrian, an obstacle, a traffic signal, a traffic sign, a lane, and the like.

Note that FIG. 25 illustrates examples of imaging ranges of the imaging units 12101 to 12104. An imaging range 12111 indicates an imaging range of the imaging unit 12101 disposed in a front nose. Imaging ranges 12112 and 12113 indicate imaging ranges of the imaging units 12102 and 12103 disposed in side mirrors, respectively. An imaging range 12114 indicates an imaging range of the imaging unit 12104 disposed in a rear bumper or a back door. For example, by superimposing image data imaged by the imaging units 12101 to 12104 on one another, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 determines a distance to each three-dimensional object in the imaging range 12111 to 12114 and a temporal change (relative speed with respect to the vehicle 12100) of the distance on the basis of the distance information obtained from the imaging units 12101 to 12104, and can thereby particularly extract a three-dimensional object which is the nearest three-dimensional object on a traveling path of the vehicle 12100 and is traveling at a predetermined speed (for example, 0 km/h or more) in substantially the same direction as the vehicle 12100 as a preceding vehicle. Moreover, the microcomputer 12051 can set an inter-vehicle distance to be secured in advance in front of the preceding vehicle, and can perform automatic brake control (including following stop control), automatic acceleration control (including following start control), and the like. In this way, it is possible to perform cooperative control aiming at, for example, automatic driving that autonomously travels without depending on driver's operation.

For example, the microcomputer 12051 classifies three-dimensional object data related to a three-dimensional object into a two-wheeled vehicle, a regular vehicle, a large vehicle, a pedestrian, and another three-dimensional object such as a telegraph pole on the basis of the distance information obtained from the imaging units 12101 to 12104 and extracts data, and can use the extracted data for automatic avoidance of an obstacle. For example, the microcomputer 12051 identifies an obstacle around the vehicle 12100 as an obstacle that a driver of the vehicle 12100 can see and an obstacle that is difficult to see. Then, the microcomputer 12051 judges a collision risk indicating a risk of collision with each obstacle. When the collision risk is higher than a set value and there is a possibility of collision, the microcomputer 12051 can perform driving assistance for avoiding collision by outputting an alarm to a driver via the audio speaker 12061 or the display unit 12062, or performing forced deceleration or avoiding steering via the drive system control unit 12010.

At least one of the imaging units 12101 to 12104 may be an infrared camera for detecting an infrared ray. For example, the microcomputer 12051 can recognize a pedestrian by determining whether or not a pedestrian exists in imaged images of the imaging units 12101 to 12104. Such recognition of a pedestrian is performed by, for example, a procedure of extracting characteristic points in imaged images of the imaging units 12101 to 12104 as infrared cameras and a procedure of performing pattern matching processing on a series of characteristic points indicating an outline of an object and determining whether or not a pedestrian exists. If the microcomputer 12051 determines that a pedestrian exists in imaged images of the imaging units 12101 to 12104 and recognizes a pedestrian, the audio image output unit 12052 controls the display unit 12062 such that the display unit 12062 superimposes and displays a rectangular contour line for emphasis on the recognized pedestrian. Furthermore, the audio image output unit 12052 may control the display unit 12062 such that the display unit 12062 displays an icon or the like indicating a pedestrian at a desired position.

Note that the effects described here are merely examples, and the effects of the present technology are not limited thereto, and may include other effects.

Note that embodiments of the present technology are not limited to the above-described embodiments, and various modifications can be made to them without departing from the scope of the present technology.

Note that the present technology can have the following configurations.

(1)
A semiconductor device including:
a through hole that penetrates a semiconductor substrate;
an electrode at the center of the through hole; and
a space around the electrode.

(2)
The semiconductor device according to (1), in which the through hole also penetrates an insulating film formed on the semiconductor substrate.

(3)
The semiconductor device according to (1) or (2), further including
a barrier metal around the electrode.

(4)
The semiconductor device according to any one of (1) to (3), further including
an insulating film in the semiconductor substrate and the space.

(5)
The semiconductor device according to any one of (1) to (4), in which
the semiconductor device has a multilayer structure, and the electrode connects wirings formed in different layers to each other.

(6)
The semiconductor device according to any one of (1) to (5), in which
the electrode and the wiring include a same material.

(7)
The semiconductor device according to any one of (1) to (6), in which
the electrode is formed around the semiconductor substrate left at the center of the through hole.

(8)
The semiconductor device according to any one of (1) to (7), in which
the through hole also penetrates an insulating film formed on the semiconductor substrate, and
a space between the through hole and the insulating film is filled with an insulating material.

(9)
The semiconductor device according to any one of (1) to (8), in which
the electrode is connected to a bump.

(10)
An imaging device including:
a photoelectric conversion unit that performs photoelectric conversion; and
an inter-pixel light shielding unit formed between the photoelectric conversion units each formed in an adjacent pixel through a semiconductor substrate in a depth direction, in which
the inter-pixel light shielding unit includes a light shielding member at the center, and has a space between the light shielding member and the semiconductor substrate.

(11)
The imaging device according to (10), further including
a light shielding film formed on an incident surface side of the photoelectric conversion unit, in which
the light shielding film and the light shielding member of the inter-pixel light shielding unit are integrally formed using a same material.

(12)
A manufacturing apparatus for manufacturing a semiconductor device including:
a through hole that penetrates a semiconductor substrate;
an electrode at the center of the through hole; and
a space around the electrode.

(13)
The manufacturing apparatus according to (12), in which
the through hole is formed in the semiconductor substrate,
a film is formed using a predetermined material on a side surface of the through hole,
the electrode is formed in the through hole in which the film is formed, and
the film is removed to form the space.

(14)
The manufacturing apparatus according to (13), in which
the film includes a two-layer film including different materials, and
one-layer film of the two-layer film is removed to form the space.

(15)
The manufacturing apparatus according to (14), in which
the two-layer film includes a SiC film and a SiO film, and the SiO film is removed.

(16)

The manufacturing apparatus according to any one of (13) to (15), in which after the through hole, the film, and the electrode are formed, the semiconductor substrate is thinned, and the film is removed from the thinned semiconductor substrate.

REFERENCE SIGNS LIST

10 CMOS image sensor
11 Pixel region
12 Control circuit
13 Logic circuit
14 Pixel drive line
15 Vertical signal line
21 Vertical drive unit
22 Column processing unit
23 Horizontal drive unit
24 System control unit
31 Signal processing unit
32 Memory
51 Semiconductor substrate
52 Semiconductor substrate
53 Semiconductor substrate
54 Semiconductor substrate
55 Semiconductor substrate
71 Logic circuit chip
72 Memory chip
73 CIS chip
81 Through electrode
101 Si substrate
102 SiO layer
103 SiO layer
105 SiO layer
111 Wiring
112 Wiring
113 AL pad
121 Electrode
122 Barrier metal
123 Hollow groove
124 SiO film
151 SiO film
153 Via
155 SiC film
157 SiO film
159 Barrier metal
161 Metal material
163 SiO film
165 Hole
167 Barrier metal
169 Copper
211 SiO film
231 Pillar
251 Wiring
256 Bump
301 Incident light
310 Pixel
311 Microlens
313 Planarization film
314 Light shielding film
315 Insulating film
316 p-Type semiconductor region
317 Light receiving surface
318 Semiconductor substrate
320 n-Type semiconductor region
341 p-Type semiconductor region
350 Wiring layer
351 Wiring
352 Insulating layer
361 Supporting substrate
401 Relieving layer

The invention claimed is:

1. A semiconductor device, comprising:
a through hole that penetrates a semiconductor substrate;
an electrode in the through hole, wherein
the electrode is around a part of the semiconductor substrate, and
the part of the semiconductor substrate is at a center of the through hole;
a barrier metal film around the electrode,
wherein a material of the barrier metal film includes one of tantalum (Ta), titanium (Ti), tungsten (W), or zirconium (Zr);
a space around the barrier metal film; and
a first insulating film between the semiconductor substrate and the space,
wherein the first insulating film is in contact with the semiconductor substrate.

2. The semiconductor device according to claim 1, further comprising a second insulating film on the semiconductor substrate, wherein the through hole penetrates the second insulating film.

3. The semiconductor device according to claim 1, wherein
the semiconductor device has a multilayer structure that includes a plurality of layers,
a first layer of the plurality of layers includes a first wiring,
a second layer of the plurality of layers includes a second wiring, and
the electrode connects the first wiring to the second wiring.

4. The semiconductor device according to claim 3, wherein the electrode and the first wiring include the same material.

5. The semiconductor device according to claim 1, further comprising:
a second insulating film on the semiconductor substrate, wherein the through hole penetrates the second insulating film; and
an insulating material between the through hole and the second insulating film.

6. The semiconductor device according to claim 1, wherein the electrode is connected to a bump.

7. An imaging device, comprising:
a semiconductor substrate;
a plurality of pixels, wherein
each of the plurality of pixels includes a photoelectric conversion unit that extends in a depth direction of the semiconductor substrate, and
the photoelectric conversion unit of each of the plurality of pixels is configured to perform photoelectric conversion; and
an inter-pixel light shielding unit between the photoelectric conversion unit of a first pixel of the plurality of pixels and a second pixel of the plurality of pixels, wherein
the second pixel is adjacent to the first pixel, and
the inter-pixel light shielding unit includes:
a light shielding member at a center of the inter-pixel light shielding unit;
a barrier metal film around the light shielding member, wherein a material of the barrier metal film includes one of tantalum (Ta), titanium (Ti), tungsten (W), or zirconium (Zr);

a space between the barrier metal film and the semiconductor substrate; and an insulating film between the semiconductor substrate and the space, wherein the insulating film is in contact with the semiconductor substrate.

8. The imaging device according to claim 7, further comprising a light shielding film on an incident surface side of the photoelectric conversion unit, wherein the light shielding film and the light shielding member of the inter-pixel light shielding unit comprise the same material.

9. A manufacturing apparatus to manufacture a semiconductor device, the semiconductor device including:

a through hole that penetrates a semiconductor substrate;

an electrode in the through hole, wherein
the electrode is around a part of the semiconductor substrate, and
the part of the semiconductor substrate is at a center of the through hole;

a barrier metal film around the electrode,
wherein a material of the barrier metal film includes one of tantalum (Ta), titanium (Ti), tungsten (W), or zirconium (Zr);

a space around the barrier metal film; and an insulating film between the semiconductor substrate and the space, wherein the insulating film is in contact with the semiconductor substrate.

10. The manufacturing apparatus according to claim 9, further comprising a film comprising a specific material on a side surface of the through hole, wherein the space is based on removal of the film.

11. The manufacturing apparatus according to claim 10, wherein the film includes a two-layer film including different materials, and the space is based on removal of one-layer film of the two-layer film.

12. The manufacturing apparatus according to claim 11, wherein the two-layer film includes a SiC film and a SiO film, and the space is based on removal of the SiO film.

13. The manufacturing apparatus according to claim 10, wherein after formation of the through hole, the film, and the electrode, the semiconductor substrate is thinned, and the film is removed from the thinned semiconductor substrate.

* * * * *